(12) United States Patent
Kudaishi et al.

(10) Patent No.: US 7,995,984 B2
(45) Date of Patent: Aug. 9, 2011

(54) SEMICONDUCTOR DEVICE

(75) Inventors: Tomoaki Kudaishi, Tokyo (JP); Satoshi Sakurai, Tokyo (JP); Takayuki Tsutsui, Tokyo (JP); Masashi Yamaura, Tokyo (JP); Reiichi Arai, Tokyo (JP); Takayuki Maehara, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 481 days.

(21) Appl. No.: 12/244,908

(22) Filed: Oct. 3, 2008

(65) Prior Publication Data

US 2009/0130996 A1   May 21, 2009

(30) Foreign Application Priority Data

Nov. 21, 2007   (JP) ................................. 2007-301138

(51) Int. Cl.
*H04B 1/28* (2006.01)
(52) U.S. Cl. ........................ 455/333; 455/334
(58) Field of Classification Search .................. 455/307, 455/323, 333, 334
See application file for complete search history.

(56) References Cited

U.S. PATENT DOCUMENTS

| | | | | |
|---|---|---|---|---|
| 7,095,102 B2* | 8/2006 | Kajimoto et al. | ............. | 257/679 |
| 7,177,171 B2* | 2/2007 | Kasai | ............................. | 365/63 |
| 7,336,939 B2* | 2/2008 | Gomez | ........................ | 455/307 |
| 7,456,790 B2* | 11/2008 | Isono et al. | ............ | 343/700 MS |
| 2008/0142965 A1* | 6/2008 | Wang et al. | ................... | 257/737 |

FOREIGN PATENT DOCUMENTS

| | | |
|---|---|---|
| JP | 7-45782 | 2/1995 |
| JP | 2006-180151 | 7/2006 |

* cited by examiner

*Primary Examiner* — Nhan Le
(74) *Attorney, Agent, or Firm* — Mattingly & Malur, PC

(57) ABSTRACT

The present invention aims to reduce an exclusively-possessed area of each of bonding wires mounted over a wiring board, for coupling a power amplifying unit of a semiconductor chip and an antenna switch of a second semiconductor chip in a semiconductor device that configures an RF module. In the RF module, the first semiconductor chip and the second semiconductor chip are mounted side by side in a central area of the wiring board. The first semiconductor chip is formed with amplifier circuits and a control circuit and comprises a silicon substrate or a compound semiconductor substrate. On the other hand, the second semiconductor chip is formed with an antenna switch and comprises the silicon substrate or compound semiconductor substrate. Pads of the first semiconductor chip and pads of the second semiconductor chip are respectively electrically coupled to one another. This coupling is carried out by the bonding wires formed in the surface of the wiring board and the bonding wires formed inside the wiring board.

24 Claims, 24 Drawing Sheets

SEMICONDUCTOR DEVICE

CROSS-REFERENCE TO RELATED APPLICATIONS

The disclosure of Japanese Patent Application No. 2007-301138 filed on Nov. 21, 2007 including the specification, drawings and abstract is incorporated herein by reference in its entirety.

BACKGROUND OF THE INVENTION

The present invention relates to a semiconductor device, and particularly to a technique effective when applied to an RF (Radio Frequency) module used in a cellular phone or the like.

A power amplifying module has been disclosed in Japanese Unexamined Patent Publication No. 2006-180151 (patent document 1). In the power amplifying module, an LDMOSFET (Laterally Diffused Metal Oxide Semiconductor Field Effect Transistor) is formed in one semiconductor chip that configures part of the power amplifying module. Such a configuration that coupling terminals formed in the surface of a wiring board equipped with the one semiconductor chip, and pads formed in a semiconductor chip are respectively coupled by wires has been disclosed in the patent document 1.

In Japanese Unexamined Patent Publication No. Hei 07 (1995)-045782 (patent document 2), a plurality of wires for coupling an encrypted-data decrypting chip and a CPU chip formed over a multilayer board are formed in the multilayer board. The wires and the encrypted-data decrypting chip, and the wires and the CPU chip are respectively coupled to one another by wire bonding. The wires include wires formed in a surface layer of the multilayer board and wires formed inside the multilayer board.

SUMMARY OF THE INVENTION

Mobile communication apparatuses typified by communication systems like a GSM (Global System for Mobile Communications) system, a PCS (Personal Communication System), a PDC (Personal Digital Cellular) system and a CDMA (Code Division Multiple Access) system have recently been in widespread use on a worldwide basis. This type of mobile communication apparatus generally comprises an antenna for performing the emission and reception of a radio wave, an antenna switch for performing switching of transmission/reception at the antenna, a high frequency power amplifier (RF module) for amplifying a power-modulated high frequency signal and supplying the same to the antenna, a receiving unit for signal-processing the high frequency signal received by the antenna, a controller for controlling them, and a battery for supplying a source voltage to them.

As amplifying elements used in a power amplifying circuit of the RF module in the mobile communication apparatus, a compound semiconductor device such as an HBT, an HEMT or the like, a silicon bipolar transistor, an LDMOSFET (Laterally Diffused Metal Oxide Semiconductor Field Effect Transistor), etc. have been used according to purposes and circumstances.

As the RF module, there is known, for example, one in which a power amplifying unit (power amplifier circuit) for amplifying power and a power controller for controlling the amplification by the power amplifying unit are formed in one semiconductor chip comprised of silicon. At this time, the power amplifying unit is configured so as to perform three-stage amplification. There is known, for example, one in which LDMOSFETs are used as all amplifying elements for the three stages. A normal CMOSFET (Complementary Metal Oxide Semiconductor Field Effect Transistor) is used as for the power controller.

The RF module is formed by mounting the semiconductor chip configured in this way over its corresponding wiring board. Here, the RF module is also equipped with matching circuits for taking impedance matching to transfer power efficiently in addition to the semiconductor chip formed with the power amplifying unit and the power controller. Each of the matching circuits comprises passive components such as capacitive elements, inductance elements or capacitive elements and is mounted over the wiring board that configures the RF module. Further, an RF module equipped with an antenna switch has also appeared in recent years. The antenna switch comprises, for example, a compound semiconductor chip with a p channel type high electron mobility transistor (HEMT) as a switch element. In such an RF module, the compound semiconductor chip that configures the antenna switch is also mounted over the wiring board in addition to the semiconductor chip comprised of silicon, which configures the power amplifying unit and the power controller, and the matching circuits each comprised of the passive components.

The semiconductor chip that configures the power amplifying unit and the power controller, the matching circuits and the compound semiconductor chip that configures the antenna switch are coupled to one another by wires formed in the wiring board. Described specifically, the power amplifying unit that configures the semiconductor chip is electrically coupled to its corresponding matching circuit formed outside the semiconductor chip. Each of the matching circuits is coupled to its corresponding low-pass filter externally attached to the RF module. The low-pass filter is coupled to the antenna switch mounted inside the RF module. With such a configuration, the signal whose power has been amplified by the power amplifying unit is transferred efficiently via the corresponding matching circuit. Harmonic noise contained in the signal outputted from the matching circuit is eliminated by the corresponding low-pass filter and the so-processed signal is thereafter transmitted from the antenna via the antenna switch. The transmission of the amplified signal is conducted in this way.

At this time, control of the antenna switch is conducted under the control from the power controller. That is, while the transmission/reception of each signal is done by selecting the switch that configures the antenna switch, this control is conducted under the control from the power controller. Thus, the power controller contained in the semiconductor chip and the antenna switch contained in the compound semiconductor chip are electrically coupled to each other. Described specifically, this coupling is done by mounting the semiconductor chip and the compound semiconductor chip side by side over the wiring board and coupling the semiconductor chip and the compound semiconductor chip by wires and bonding wires. That is, first pads coupled to the power controller are formed in the semiconductor chip, and the first pads and one ends of the bonding wires formed in the surface of the wiring board are coupled by their corresponding wires. On the other hand, the other ends of the bonding wires are respectively coupled to second pads formed in the compound semiconductor chip by wires. The second pads formed in the compound semiconductor chip are coupled to the antenna switch. The power controller of the semiconductor chip and the antenna switch of the compound semiconductor switch are electrically coupled to each other in this way. This electrical coupling is conducted by coupling a plurality of the boding wires and a plurality of the first pads respectively by a plurality of the wires and coupling a plurality of the bonding wires and a plurality of the second pads respectively by a plurality of the wires.

Here, although the forming area width of the bonding wires for coupling the power controller of the semiconductor chip and the antenna switch of the compound semiconductor chip has been set larger than one side of the semiconductor chip or one side of the compound semiconductor chip in the conventional RF module, the number of components mounted overt the RF module is small and the above point has not become a factor for restriction of the design freedom of the wiring board.

Meanwhile, multifunctioning and downsizing of a cellular phone has been in progress in recent years. As one example of the multifunctioning of the cellular phone, may be mentioned, one for allowing signals lying in a plurality of different frequency bands and signals different in transmission/reception system to be transmitted/received. Therefore, the number of channels switched by an antenna switch increases and the number of bonding wires for coupling a power controller and the antenna switch also increases with its increase. Therefore, the forming area of each of the bonding wires shared for an RF module is becoming innegligible. Further, there has been a demand for downsizing of the RF module with the size reduction in the cellular phone. The areas exclusively possessed by the plural bonding wires for coupling the power controller and the antenna switch encroach on a forming area of each matching circuit, and the degree of freedom of wiring for the matching circuit is hence reduced. That is, a plurality of bonding wires are formed between a semiconductor chip that configures a power amplifying unit and a compound semiconductor chip that configure the antenna switch. While, at this time, the area width in which the bonding wires are laid out becomes larger than one side of the semiconductor chip or one side of the compound semiconductor substrate, this is becoming manifest as a factor that encroaches on the area of forming each matching circuit of the RF module.

Further, it has heretofore been practised to mount the low-pass filters formed outside the RF module within the RF module. Thus, there is a need to ensure the area of forming each low-pass filter in the RF module. Increasing the areas exclusively possessed by the bonding wires for coupling the power controller and the antenna switch becomes a problem even in terms of this respect.

An object of the present invention is to provide a technique capable of reducing an exclusively-possessed area of each of bonding wires mounted over a wiring board, for coupling a power controller of a semiconductor chip and an antenna switch of a compound semiconductor chip in a semiconductor device that configures an RF module.

The above and other objects and novel features of the present invention will become apparent from the description of the present specification and the accompanying drawings.

A summary of a representative one of the inventions disclosed in the present application will be explained in brief as follows:

A semiconductor device according to the present invention comprises (a) a wiring board having a multilayered wiring structure, (b) a first semiconductor chip mounted over the wiring board, which functions as a power controller for controlling power amplification, and (c) a second semiconductor chip mounted over the wiring board, which functions as an antenna switch. Electrical coupling between the power controller of the first semiconductor chip and the antenna switch of the semiconductor chip is conducted in the following manner. That is, the electrical coupling is conducted by a plurality of first wires for electrically coupling a plurality of first pads formed in the first semiconductor chip and a plurality of bonding wires formed in the wiring board respectively, and (d2) a plurality of second wires for electrically coupling the bonding wires and a plurality of second pads formed in the second semiconductor chip respectively. Here, the bonding wires include a plurality of first bonding wires formed in the surface of the wiring board and a plurality of second bonding wires formed inside the wiring board.

According to a typical embodiment, a plurality of bonding wires are comprised of a plurality of first bonding wires formed in the surface of a wiring board and a plurality of second bonding wires formed inside the wiring board, thereby making it possible to reduce the number of the bonding wires formed in the surface of the wiring board. It is therefore possible to reduce the exclusively-possessed areas of the bonding wires formed in the surface of the wiring board. From this respect, for example, the areas for laying out matching circuits, low-pass filters and the like formed over a wiring board can be ensured sufficiently, and the degree of freedom for the design of the wiring board can be improved.

An advantageous effect obtained by a typical one of the inventions disclosed in the present application will be explained in brief as follows:

In a semiconductor device that configures an RF module, the exclusively-possessed areas of bonding wires formed over a wiring board, which couple a power controller of a semiconductor chip and an antenna switch of a compound semiconductor chip, can be reduced.

BRIEF DESCRIPTION OF THE DRAWINGS

FIG. 9 is a plan view and a sectional view showing part of a wiring board that forms an RF module, wherein FIG. 9(b) is a plan view illustrating a chip mounting area of the wiring board, and FIG. 9(a) is a sectional view cut along line X-X of FIG. 9(b);

DETAILED DESCRIPTION OF THE PREFERRED EMBODIMENTS

Figure 1:
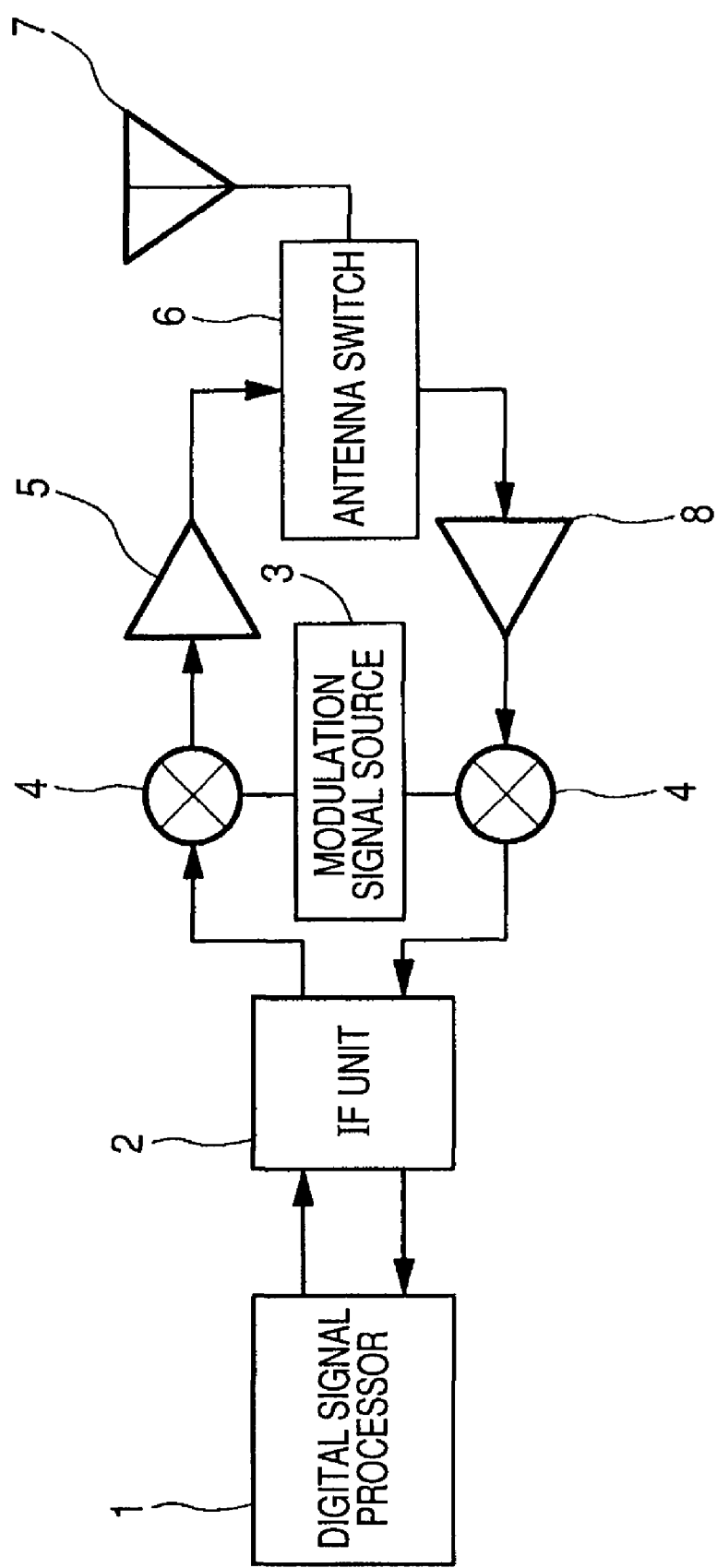
FIG. 1 is a block diagram of a signal transceiver unit employed in, for example, a digital cellular phone.

The invention will be described by being divided into a plurality of sections or embodiments whenever circumstances require it for convenience in the following embodiments. However, unless otherwise specified in particular, they are not irrelevant to one another. One thereof has to do with modifications, details and supplementary explanations of some or all of the other.

When reference is made to the number of elements or the like (including the number of pieces, numerical values, quantity, range, etc.) in the following embodiments, the number thereof is not limited to a specific number and may be greater than or less than or equal to the specific number unless otherwise specified in particular and definitely limited to the specific number in principle.

It is further needless to say that components (including element or factor steps, etc.) employed in the following embodiments are not always essential unless otherwise specified in particular and considered to be definitely essential in principle.

Similarly, when reference is made to the shapes, positional relations and the like of the components or the like in the following embodiments, they will include ones substantially analogous or similar to their shapes or the like unless otherwise specified in particular and considered not to be definitely so in principle, etc. This is similarly applied even to the above-described numerical values and range.

The same reference numerals are respectively attached to the same components or members in all the drawings for describing the embodiments in principle, and their repetitive explanations will be omitted. Incidentally, some hatching might be provided to make it easy to view the drawings even in the case of plan views.

A MOSFET described in each of the embodiments shown below is one example of a MISFET (Metal Insulator Semiconductor Field Effect Transistor). The present invention includes where a high dielectric constant film higher in dielectric constant than a silicon oxide film is used, etc. in addition to the case where the silicon oxide film is used for a gate insulating film.

First Embodiment

<Configuration and Operation of Transceiver Unit Employed in Digital Cellular Phone>

FIG. 1 is a block diagram of a signal transceiver unit employed in, for example, a digital cellular phone. In FIG. 1, the signal transceiver unit has a digital signal processor 1, an IF (Intermediate Frequency) unit 2 a modulation signal source 3, a mixer 4, an RF module 5, an antenna switch 6, an antenna 7 and a low noise amplifier 8.

The digital signal processor 1 is capable of digitally processing an analog signal such as a voice or audio signal thereby generating a baseband signal. The IF unit 2 can convert the baseband signal generated at the digital signal processor 1 to a signal having an intermediate frequency.

The modulation signal source 3 is of a circuit which obtains a modulation signal using a reference oscillator such as a crystal oscillator stable in frequency. The mixer 4 is of a frequency converter which performs frequency conversion.

The RF module 5 is of a circuit which newly generates a high-power signal analogous to a weak input signal by power supplied from a power supply or source and outputs the same therefrom.

The antenna switch 6 is provided to separate a signal inputted to the digital cellular phone and a signal outputted from the digital cellular phone from each other.

The antenna 7 is provided to transmit and receive a radio wave. The low noise amplifier 8 is provided to amplify a signal received by the antenna 7.

The digital cellular phone is configured in the above-descried manner. The operation thereof will be explained below in brief. A description will be made of a case in which a signal is transmitted. A baseband signal generated by digitally processing an analog signal such as an audio signal by means of the digital signal processor 1 is converted to a signal having an intermediate frequency at the IF unit 2. Subsequently, the signal having the intermediate frequency is converted to an RF (Radio Frequency) signal by the modulation signal source 3 and the mixer 4. The signal converted to the RF signal is inputted to the RF module 5. The RF signal inputted to the RF module 5 is amplified by the RF module 5 and thereafter transmitted through the antenna 7 via the antenna switch 6.

A description will next be made of a case in which a signal is received. An RF signal received by the antenna 7 is amplified by the low noise amplifier 8. Subsequently, the signal amplified by the low noise amplifier 8 is converted to a signal having an intermediate frequency by the modulation signal source 3 and the mixer 4, followed by being inputted to the IF unit 2. The IF unit 2 detects the signal having the intermediate frequency to extract a baseband signal. Thereafter, the baseband signal is processed by the digital signal processor 1 from which an audio signal is outputted.

<Configuration of RF Module>

Figure 2:
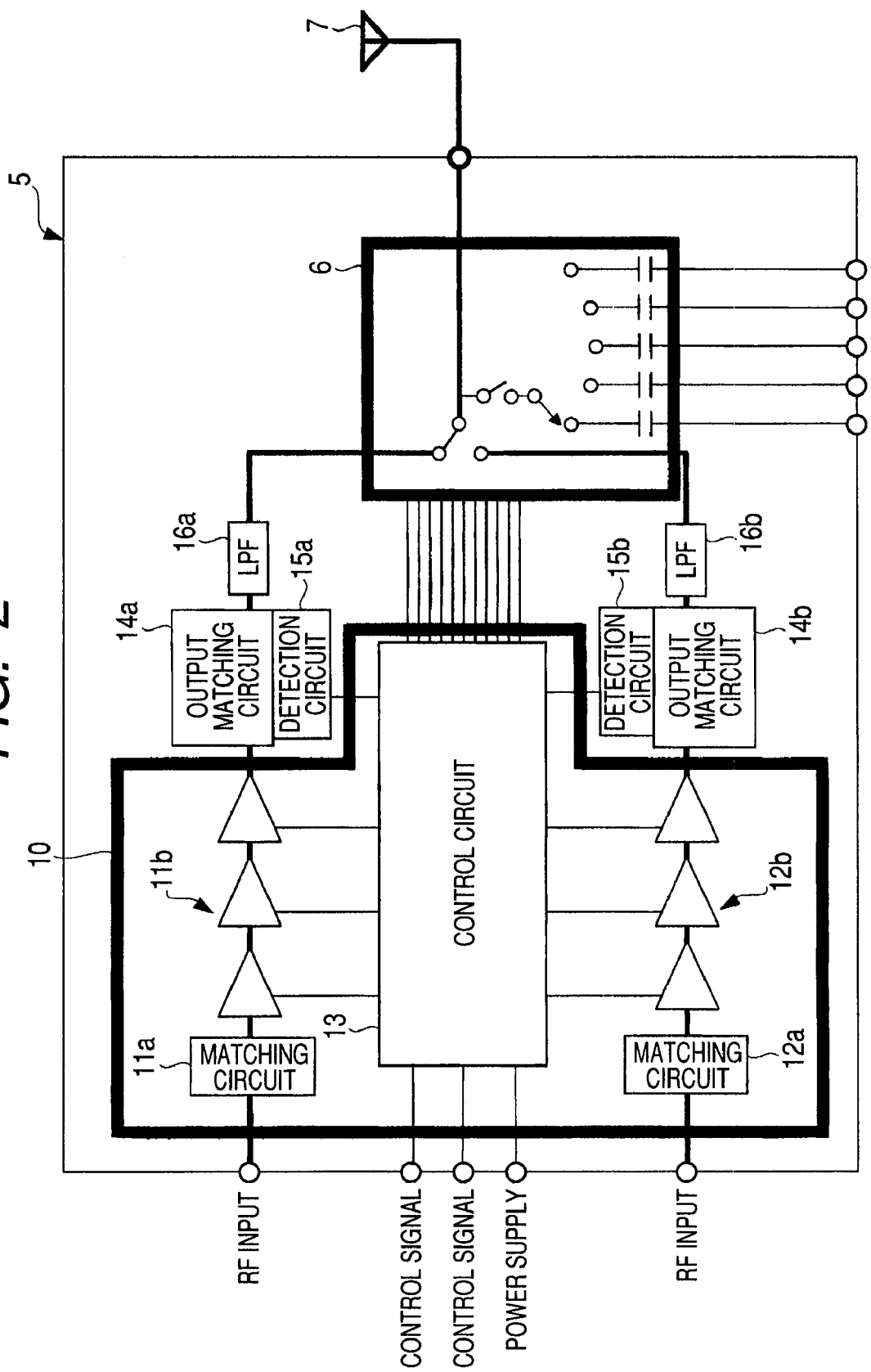
FIG. 2 is a diagram showing a circuit block configuration of an RF module according to a first embodiment of the present invention.

When the signal is transmitted from the digital cellular phone, the signal is amplified by the RF module 5 as described above. A circuit block configuration of the RF module 5 will next be explained. FIG. 2 is a diagram showing the circuit block configuration of the RF module 5 according to the first embodiment. In FIG. 2, the RF module 5 according to the first embodiment includes an amplifying unit 10, output matching circuits 14a and 14b, detection circuits 15a and 15b, low-pass filters (LPF) 16a and 16b and an antenna switch 6.

The amplifying unit 10 comprises matching circuits 11a and 12a, amplifier circuits 11b and 12b and a control circuit 13. The matching circuit 11a is capable of suppressing the reflection of a signal (RF input) inputted to the RF module 5 thereby outputting the same to the corresponding amplifier circuit 11b efficiently. The matching circuit 11a is formed of passive components such as an inductor, a capacitive element and a resistive element, which are combined such that impedance matching with the input signal can be taken. The signal inputted to the matching circuit 11a is of a signal lying in a first frequency band. As the signal lying in the first frequency band, may be mentioned, for example, a signal using the GSM (Global System for Mobile Communication) system. This signal is of a signal which uses a range of 824 MHz to 915 MHz corresponding to a GSM low frequency band as a frequency band.

The amplifier circuit 11b is coupled to the matching circuit 11a and amplifies the input signal outputted from the matching circuit 11a. That is, the amplifier circuit 11b is of an amplifier for amplifying the input signal lying in the GSM low frequency band. The amplifier circuit 11b comprises three amplifying stages, for example. In the amplifier circuit 11b, the input signal lying in the GSM low frequency band, which has been outputted from the matching circuit 11a, is first amplified by the amplifying stage corresponding to the first stage. Then, the input signal amplified by the amplifying stage corresponding to the first stage is amplified by the amplifying stage corresponding to the middle stage. Further, the input signal is amplified by the amplifying stage corresponding to the final stage. A high power amplified signal analogous to the weak input signal can be obtained by the amplifier circuit 11b.

While the amplifying unit 10 has the matching circuit 11a and amplifier circuit 11b for amplifying the input signal lying in the GSM low frequency band in this way, the amplifying unit 10 can further amplify even an input signal lying in a GSM high frequency band. Described specifically, the amplifying unit 10 further includes the matching circuit 12a and the amplifier circuit 12b.

The matching circuit 12a is capable of suppressing the reflection of a signal (RF input) inputted to the RF module 5 thereby outputting the same to the corresponding amplifier circuit 12b efficiently. The matching circuit 12a is formed of passive components such as an inductor, a capacitive element and a resistive element, which are combined such that impedance matching with the input signal can be taken. The signal inputted to the matching circuit 12a is of a signal lying in a second frequency band. As the signal lying in the second frequency band, may be mentioned, for example, a signal using the GSM (Global System for Mobile Communication) system. This signal is of a signal which uses a range of 1710 MHz to 1910 MHz corresponding to a GSM high frequency band as a frequency band. The matching circuit 12a is of a matching circuit for each signal lying in the GSM high frequency band and is comprised of passive components having numeric values different from those of the matching circuit for the signal lying in the GSM low frequency band referred to above.

The amplifier circuit 12b is coupled to the matching circuit 12a and amplifies the input signal outputted from the matching circuit 12a. That is, the amplifier circuit 12b is of an amplifier for amplifying the input signal lying in the GSM high frequency band. The amplifier circuit 12b comprises three amplifying stages, for example. In the amplifier circuit 12b, the input signal lying in the GSM high frequency band, which has been outputted from the matching circuit 12a, is first amplified by the amplifying stage corresponding to the first stage. Then, the input signal amplified by the amplifying stage corresponding to the first stage is amplified by the amplifying stage corresponding to the middle stage. Further, the input signal is amplified by the amplifying stage corresponding to the final stage. A high power amplified signal analogous to the weak input signal can be obtained by the amplifier circuit 12b.

As described above, the amplifying unit 10 according to the first embodiment is capable of amplifying signals lying in different frequency bands like the signal lying in the GSM low frequency band and the signal lying in the GSM high frequency band. The amplifying unit 10 has the control circuit 13 for controlling the amplifier circuit 11b for amplifying the signal lying in the GSM low frequency band and the amplifier circuit 12b for amplifying the signal lying in the GSM high frequency band. The control circuit 13 applies bias voltages to the amplifier circuit 11b and the amplifier circuit 12b respectively in accordance with a power supply (source voltage) and control signals (power control voltages) inputted to the RF module 5 thereby to control amplification factors.

While the control circuit 13 controls the amplifier circuit 11b and the amplifier circuit 12b in this way, it performs feedback control in such a manner that the amplification factor of the amplifier circuit 11b and the amplification factor of the amplifier circuit 12b become constant. A description will be made of the configuration of the feedback control.

In order to realize the feedback control, a directional coupler (coupler) (not shown) is provided at the output of the amplifier circuit 11b for amplifying the signal lying in the GSM low frequency band. The directional coupler is capable of detecting the power of the signal amplified by the amplifier circuit 11b. Described specifically, the directional coupler is formed of a wiring or wire that forms a main line and a wiring or wire that forms a sub line, and detects the power of the amplified signal traveling on the main line by means of electromagnetic coupling through the sub line.

The directional coupler is coupled to the detection circuit 15a. The detection circuit 15a converts the power detected by the directional coupler to the voltage or current and outputs a detection signal to the control circuit 13. Thus, the feedback control is realized by the directional coupler and the detection circuit 15a. The control circuit 13 calculates a difference between the detection signal inputted from the detection circuit 15a and its corresponding control signal (power control voltage) and adjusts a bias voltage applied to the amplifier circuit 11b in such a manner that the calculated difference is eliminated. Thus, the control circuit 13 controls the amplification factor of the amplifier circuit 11b in such a manner that its amplification factor becomes constant. Likewise, a directional coupler (coupler) (not shown) is provided at the output of the amplifier circuit 12b for amplifying the signal lying in the GSM high frequency band. The detection circuit 15b is coupled to the directional coupler. A signal detected by the detection circuit 15b is inputted to the controller 13.

Next, the output matching circuit 14a inputs therein the signal amplified by the amplifier circuit 11b included in the amplifying unit 10 and takes impedance matching of the amplified signal. That is, the output matching circuit 14a has the function of transmitting the signal amplified by the amplifier circuit 11b efficiently. The output matching circuit 14a comprises passive components such as an inductor, a capacitive element and a resistive element. The output matching circuit 14a is of a matching circuit for each signal lying in the GSM low frequency band because the signal amplified by the amplifier circuit 11b is inputted thereto.

The low-pass filter 16a is coupled to the output matching circuit 14a and has the function of eliminating harmonic noise. While the signal lying in the GSM low frequency band is amplified where the input signal is amplified by the amplifier circuit 11b, for example, a harmonic of an integral multiple of the GSM low frequency band is also generated at this time. While this harmonic is contained in the signal lying in the GSM low frequency band, it becomes a noise component different in frequency from the amplified signal lying in the GSM low frequency band. Accordingly, it is necessary to remove harmonic components from the amplified signal lying in the GSM low frequency band. One having such a function is of the low-pass filter 16a coupled after the output matching circuit 14a. The low-pass filter 16a functions as a selection circuit which causes signals lying plural frequency bands to signals lying in a frequency band in a specific range to pass therethrough. That is, the low-pass filter 16a causes the amplified signal lying in the GSM low frequency band to pass therethrough and attenuates harmonics higher in frequency than the amplified signal lying in the GSM low frequency band. Harmonic noise contained in the amplified signal lying in the GSM low frequency band can be reduced.

Subsequently, the output matching circuit 14b and the low-pass filter 16b are coupled even to the output of the amplifier circuit 12b for generating the amplified signal lying in the GSM high frequency band. Described specifically, the output matching circuit 14b inputs therein the signal amplified by the amplifier circuit 12b included in the amplifying unit 10 and takes impedance matching of the amplified signal. That is, the output matching circuit 14b has the function of transmitting the signal amplified by the amplifier circuit 12b efficiently. The output matching circuit 14b comprises passive components such as an inductor, a capacitive element and a resistive element. The output matching circuit 14b is of a matching circuit for each signal lying in the GSM low frequency band because the signal amplified by the amplifier circuit 12b is inputted thereto.

The low-pass filter 16b is coupled to the output matching circuit 14b and has the function of eliminating harmonic noise. While the signal lying in the GSM high frequency band is amplified where the input signal is amplified by the amplifier circuit 12b, for example, a harmonic of an integral multiple of the GSM high frequency band is also generated at this time. While this harmonic is contained in the signal lying in the GSM high frequency band, it becomes a noise component different in frequency from the amplified signal lying in the GSM high frequency band. Accordingly, it is necessary to remove harmonic components from the amplified signal lying in the GSM high frequency band. One having such a function is of the low-pass filter 16b coupled after the output matching circuit 14b. The low-pass filter 16b functions as a selection circuit that causes signals lying plural frequency bands to signals lying in a frequency band in a specific range to pass therethrough. That is, the low-pass filter 16b causes the amplified signal lying in the GSM high frequency band to pass therethrough and attenuates harmonics higher in frequency than the amplified signal lying in the GSM high frequency band. Harmonic noise contained in the amplified signal lying in the GSM high frequency band can be reduced by the low-pass filter 16b.

Next, the antenna switch 6 performs switching of a line coupled to the antenna 7. This line switching is conducted by a selector switch. Described specifically, the selector switch that configures the antenna switch 6 switches between the output of the low-pass filter 16a and the output of the low-pass filter 16b thereby to couple either thereof to the antenna 7. That is, when the amplified signal lying in the GSM low frequency band, which is outputted from the low-pass filter 16a, is outputted from the antenna 7, the output of the low-pass filter 16a is coupled to the antenna 7 by the selector switch. On the other hand, when the amplified signal lying in the GSM high frequency band, which is outputted from the low-pass filter 16b, is outputted from the antenna 7, the output of the low-pass filter 16b is coupled to the antenna 7 by the selector switch. Thus, the antenna switch 6 switches between the two-system outputs (transmission states) and is further capable of performing switching even in a reception state. In the reception state, the selector switch is operated such that a signal received by the antenna is outputted to receiving circuits. Since reception lines thereof also exist in plural form, the selector switch is configured such that switching to a plurality of the receiving circuits can be conducted.

Figure 3:
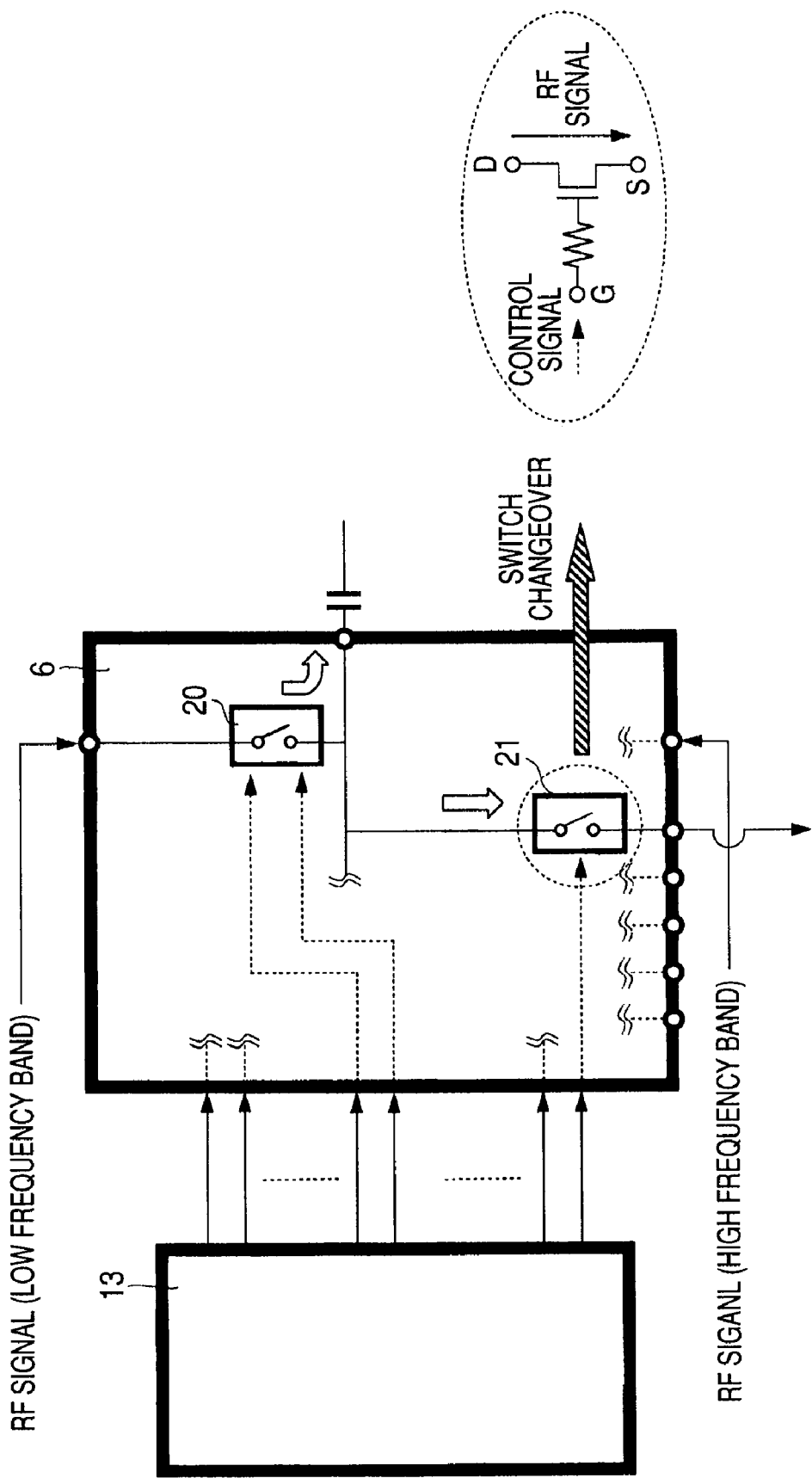
FIG. 3 is a typical diagram illustrating a concrete configuration of a selector switch that configures an antenna switch, and the manner in which the selector switch is controlled by a control circuit.

Control on the selector switch that configures the antenna switch 6 is conducted by the control circuit 13 contained in the amplifying unit 10. That is, the control circuit 13 controls the amplifier circuit 11b and the amplifier circuit 12b and also controls the antenna switch 6. FIG. 3 is a typical diagram showing a concrete configuration of the selector switch that configures the antenna switch 6, and the manner in which the selector switch is controlled by the control circuit 13. In FIG. 3, the output/non-output of an amplified signal (RF signal (low frequency band)) to the antenna (not shown) is controlled by turning ON/OFF of a selector switch 20 formed within the antenna switch 6. The output/non-output of a received signal from the antenna to each receiving circuit (not shown) is controlled by turning ON/OFF of a selector switch 21 formed within the antenna switch 6. Likewise, the output/non-output of an amplified signal (RF signal (high frequency band)) is controlled by turning ON/OFF of the selector switch lying in the antenna switch 6 although the amplified signal is not shown either in the figure.

These selector switches 20 and 21 and the like formed within the antenna switch 6 are formed of, for example, field effect transistors respectively. The amplified signal (RF signal) is transmitted between source and drain region S and D of each field effect transistor. At this time, each of the selector switches is configured in such a manner that the turning ON/OFF of the field effect transistor is controlled by applying a switch changeover control signal sent from the control circuit 13 to a gate electrode G of the field effect transistor. Thus, the turning ON/OFF of each field effect transistor can be controlled by the switch changeover control signal applied from the control circuit 13 to the gate electrode G of the field effect transistor. Accordingly, when the field effect transistor is turned ON, the source and drain regions S and D thereof are brought into conduction so that the amplified signal (RF signal) is outputted to the antenna. On the other hand, when the field effect transistor is turned OFF, the source region S and the drain region D are brought into non-conduction, so that the amplified signal (RF signal) is not outputted to the antenna. It is thus understood that the field effect transistor can be used as a selector switch.

<Operation of RF Module>

The RF module 5 according to the first embodiment is configured as described above. The operation thereof will be explained below. Although the RF module 5 is configured so as to be capable of amplifying the signal lying in the GSM low frequency band and the signal lying in the GSM high frequency band as shown in FIG. 2 in the first embodiment, the operations of the RF module 5 at the two cases are similar. Therefore, the operation of amplifying the signal lying in the GSM low frequency band will be explained. Incidentally, although the GSM system has been explained, the communication system may be other communication systems.

When a weak input signal (RF input) is inputted to the RF module 5 as shown in FIG. 2, the weak input signal is first inputted to the matching circuit 11*a*. Since the matching circuit 11*a* takes impedance matching with the weak input signal, the input signal is outputted to the amplifier circuit 11*b* efficiently without reflection. Subsequently, the signal inputted to the amplifier circuit 11*b* is amplified in power by the three amplifying stages that configure the amplifier circuit 11*b*. At this time, the amplification of its power by the amplifier circuit 11*b* is controlled by the control circuit 13. Described specifically, the control circuit 13 applies a bias voltage to the amplifier circuit 11*b*, based on the power source (source voltage) and control signals (power control voltages) inputted to the control circuit 13. In doing so, the amplifier circuit 11*b* amplifies the input signal, based on the bias voltage supplied from the control circuit 13 and outputs the amplified signal therefrom. Thus, the signal amplified by the amplifying unit 10 is outputted.

It is desirable that the amplified signal outputted from the amplifying unit 10 is constant power. However, the power of the actually-outputted amplified signal does not necessarily reach desired power due to external influences. Therefore, feedback is applied to the control circuit 13 for controlling the amplifier circuit 11*b*. The operation of its feedback circuit will be described.

The power of the signal amplified by the amplifier circuit 11*b* is detected by the directional coupler (not shown). The power detected by the directional coupler is converted to a voltage by the detection circuit 15*a* coupled to the directional coupler. A detection signal comprised of the voltage converted by the detection circuit 15*a* is inputted to the control circuit 13. On the other hand, control signals (power control voltages) inputted from outside the RF module 5 are also inputted t to the control circuit 13. The control circuit 13 calculates a difference between the detection signal converted by the detection circuit 15*a* and its corresponding control signal inputted from outside the RF module 5. Next, the control circuit 13 controls a bias voltage applied from the control circuit 13 to the amplifier circuit 11*b* in such a manner that the calculated difference is eliminated. Thus, the power of the signal amplified by the amplifier circuit 11*b* becomes constant. This operation corresponds to the operation of the feedback circuit.

Subsequently, the signal amplified by the amplifier circuit 11*b* is inputted to the output matching circuit 14*a*. Since the output matching circuit 14*a* takes impedance matching with the amplified signal, the amplified signal is outputted to the low-pass filter 16*a* efficiently without reflection. Then, the amplified signal inputted to the low-pass filter 16*a* is processed such that harmonics contained in the amplified signal are eliminated by the low-pass filter 16*a*. Thereafter, the amplified signal having passed through the low-pass filter 16*a* is inputted to the antenna switch 6. At this time, the selector switch that configures the antenna switch 6 is controlled by a switch changeover control signal outputted from the control circuit 13. In this case, the selector switch is controlled in such a manner that the low-pass filter 16*a* and the antenna 7 are electrically coupled to each other. Thus, the amplified signal outputted from the low-pass filter 16*a* is transmitted from the antenna 7 via the selector switch held in an ON state. The signal amplified by the RF module 5 can be transmitted from the antenna 7 in the above-described manner.

The operation of taking or fetching the signal received by the antenna 7 will next be explained. The selector switch is changed over by the switch changeover control signal outputted from the control circuit 13. Described specifically, the selector switch contained in the antenna switch 6 is changed over in such a manner that the antenna 7 and its corresponding receiving circuit (not shown) provided outside the RF module 5 are electrically coupled to each other. In doing so, the signal received by the antenna 7 is inputted to the receiving circuit via the selector switch that configures the antenna switch 6. The received signal is signal-processed within the receiving circuit. The signal can be received in this way.

<Mounting Configuration of RF Module>

Figure 4:
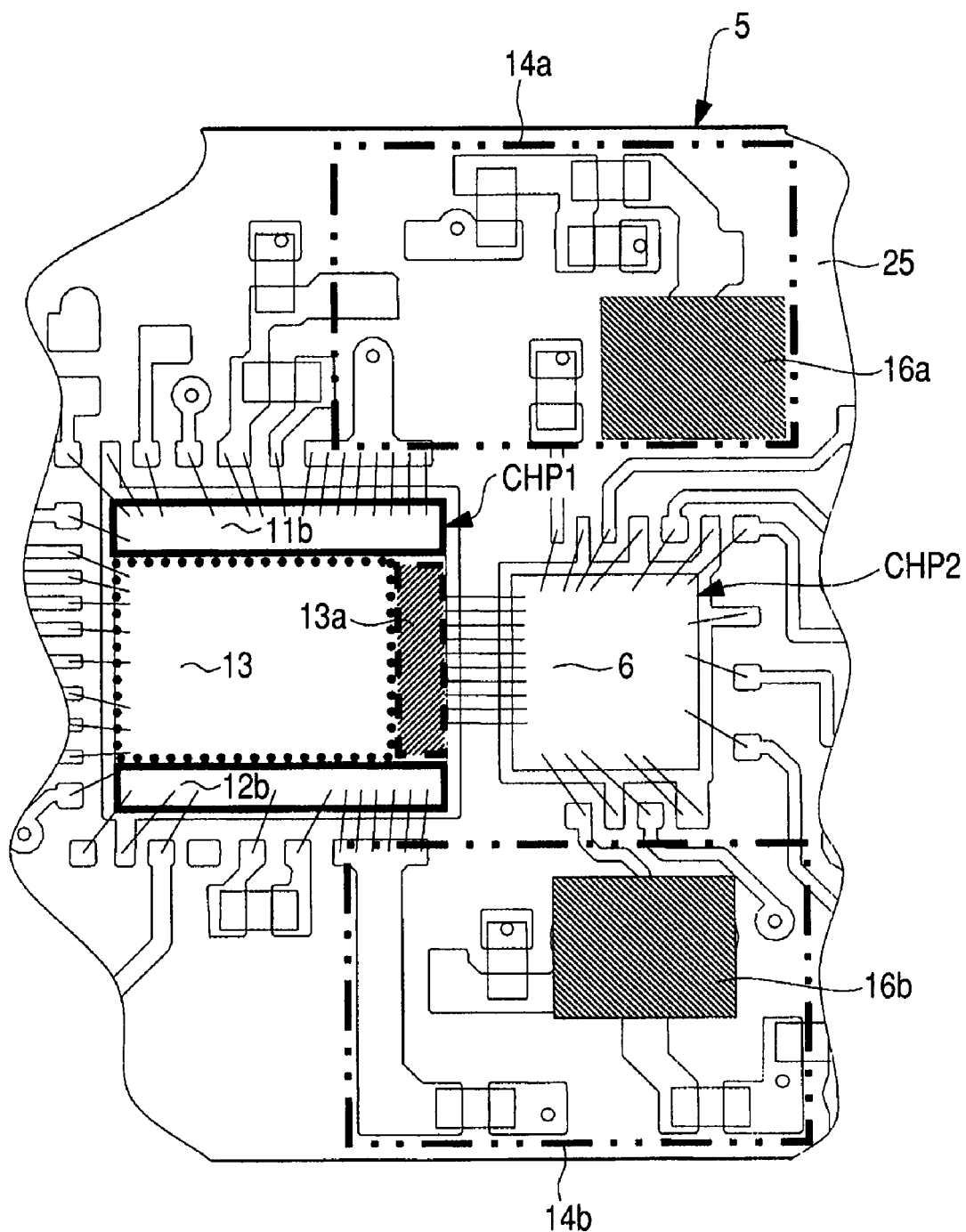
FIG. 4 is a diagram depicting an outline of a mounting configuration of the RF module.

A mounting or packaging configuration of the RF module will next be described. FIG. 4 is a diagram showing the outline of the mounting configuration of the RF module 5. As shown in FIG. 4, the RF module 5 has a semiconductor chip CHP1 and a semiconductor chip CHP2 mounted over a wiring board 25 having a multilayered wiring structure. Passive components such as inductors, capacitive elements or resistive elements are mounted over the wiring board 25 in addition to the semiconductor chip CHP1 and the semiconductor chip CHP2.

The semiconductor chip CHP1 is one in which semiconductor elements and wires are formed in a silicon substrate. The amplifier circuit 11*b*, the amplifier circuit 12*b* and the control circuit 13 shown in FIG. 2 are formed therein. The amplifier circuit 11*b* and the amplifier circuit 12*b* are respectively comprised of an LDMOSFET formed over the silicon substrate, and the control circuit 13 is comprised of a CMOSFET formed over the silicon substrate. With the formation of the amplifier circuit 11*b* and the amplifier circuit 12*b* from the LDMOSFETs and the formation of the control circuit 13 from the CMOSFET in this way, the amplifier circuit 11*b*, the amplifier circuit 12*b* and the control circuit 13 can be formed in the semiconductor chip CHIP1 comprised of one silicon substrate. It is therefore possible to realize a reduction in cost. Further, an advantage is also brought about in that a reduction in noise can be realized by forming the amplifier circuit 11*b* and the amplifier circuit 12*b* from the LDMOSFETs. That is, the LDMOSFET has the function of being capable of amplifying a signal with low noise. Since the configuration of the LDMOSFET is not directly related to the characteristic of the first embodiment, its device structure will be omitted. The details of the device structure of the LDMOSFET have been described in FIG. 6 of Japanese Unexamined Patent Publication No. 2006-180151.

The semiconductor chip CHP2 is one in which semiconductor elements and wires are formed in a compound semiconductor substrate such as a GaAs substrate. The antenna switch 6 shown in FIG. 2 is formed in the semiconductor chip CHP2. The selector switch formed in the antenna switch 6 comprises a field effect transistor. The field effect transistor used in the antenna switch 6 is formed of, for example, a high electron mobility transistor (HEMT) formed over a compound semiconductor substrate.

The high electron mobility transistor is one wherein a GaAs layer and an AlGaAs layer both high in resistance are formed over a semi-insulating GaAs substrate (compound semiconductor substrate) and a triangular well-type potential developed at a heterojunction interface between the GaAs layer and the AlGaAs layer is utilized. The high electron mobility transistor has a Schottky barrier type gate electrode with a metal film formed over the surface of the AlGaAs layer and includes a structure in which ohmic source and drain electrodes for causing current to flow through the heterojunction interface are provided with the gate electrode interposed therebetween.

The high electron mobility transistor utilizes a two-dimensional electron gas formed in the well-type potential as carriers. Since the width of the well-type potential existing in the heterojunction interface is merely a width of the same degree as the wavelength of each electron, and the electron cal only take two-dimensional motion substantially along the interface, the high electron mobility transistor has a characteristic that large electron mobility is obtained. Thus, since the high electron mobility transistor is excellent in high frequency characteristic and high-speed characteristic with the high mobility characteristic of the two-dimensional electron gas and very low in noise, the high electron mobility transistor is used in the antenna switch 6 that needs high-speed capability.

However, the semiconductor element used as the antenna switch 6 is not limited to the high electron mobility transistor formed in the compound semiconductor substrate. A field effect transistor (MOSFET) and the like formed over an SOI (Silicon On Insulator) substrate can be used. Forming the MOSFET over the SOI substrate makes it possible to perform device isolation completely and reduce the capacity of a source region or a drain region. Therefore, an advantage is brought about in that improvements in integration density and operating speed, an enhancement of a high breakdown voltage, and latch-up free achievement can be realized.

Thus, the RF module 5 is equipped with the semiconductor chip CHP1 that uses the silicon substrate and the semiconductor chip CHP2 that uses the compound semiconductor substrate. The control circuit 13 formed in the semiconductor chip CHP1 also has the function of controlling the antenna switch 6 formed in the semiconductor chip CHP2 in addition to the function of controlling the amplifier circuit 11b and the amplifier circuit 12b. Therefore, the control circuit 13 of the semiconductor chip CHP1 and the antenna switch 6 of the semiconductor chip CHP2 are electrically coupled to each other. The function of controlling the antenna switch 6 in the control circuit 13 is realized by a switch control circuit 13a contained in the control circuit 13 as shown in FIG. 4.

Since FIG. 4 typically shows that the semiconductor chip CHP1 and the semiconductor chip CHP2 are electrically couple to each other, the semiconductor chip CHP1 and the semiconductor chip CHP2 are directly coupled by wires. As will be described later in fact, however, the semiconductor chip CHP1 and the semiconductor chip CHP2 are electrically coupled using bonding wires formed in the wiring board 25. That is, pads of the semiconductor chip CHP1 and their corresponding bonding wires are coupled, and the bonding wires are coupled to their corresponding pads of the semiconductor chip CHP2. Consequently, the semiconductor chip CHP1 and the semiconductor chip CHP2 are electrically coupled to each other. Thus, the bonding wires formed in the wiring board 25 are used without directly coupling the semiconductor chip CHP1 and the semiconductor chip CHP2 by wires because it is desired to make the length of each wire as short as possible. If the length of the wire becomes short, then the influence of coupling between the wires can be reduced and the generation of noise can be suppressed.

Next, the RF module 5 shown in FIG. 4 is also equipped with output matching circuits 14a and 14b and low-pass filters 16a and 16b in addition to the semiconductor chip CHP1 and the semiconductor chip CHP2. The output matching circuit 14a and the low-pass filter 16a are used for each signal lying in the GSM low frequency band, and the output matching circuit 14b and the low-pass filter 16b are used for each signal lying in the GSM high frequency band.

The output matching circuits 14a and 14b and the low-pass filters 16a and 16b are formed using passive components such as inductors, capacitive elements or resistive elements. As shown in FIG. 4, the semiconductor chip CHP1 and the semiconductor chip CHP2 are mounted side by side in the central part of the wiring board 25 in the RF module 5. The output matching circuit 14a and the low-pass filter 16a used for each signal lying the GSM low frequency band are disposed at an upper peripheral portion (refer to FIG. 4) of the wiring board 25. The output matching circuit 14b and the low-pass filter 16b used for each signal lying in the GSM high frequency band are disposed at a lower peripheral portion (refer to FIG. 4) located on the side opposite to the upper peripheral portion with the semiconductor chip CHP1 and the semiconductor chip CHP2 interposed therebetween.

As shown in FIG. 4, the amplifier circuit 11b formed in the semiconductor chip CHP1 is coupled to the output matching circuit 14a by wires, and the low-pass filter 16a and the antenna switch 6 formed in the semiconductor chip CHP2 are coupled using wires. Likewise, the amplifier circuit 12b formed in the semiconductor chip CHP1 is coupled to the output matching circuit 14b by wires, and the low-pass filter 16b and the antenna switch 6 formed in the semiconductor chip CHP2 are coupled to each other using wires.

<Characteristic Configuration of First Embodiment>

The RF module 5 has been mounted and configured as described above. A characteristic configuration of the first embodiment will next be explained. One characteristic of the RF module 5 according to the first embodiment resides in a configuration of coupling between the semiconductor chip CHP1 and the semiconductor chip CHP2. That is, the first embodiment has one characteristic related to the configuration of coupling between the switch control circuit 13a of the semiconductor chip CHP1 and the antenna switch of the semiconductor chip CHP2.

Prior to the description of the characteristic of the RF module 5 according to the first embodiment, a description will be made of a configuration of coupling between a semiconductor chip CHP1 and a semiconductor chip CHP2 according to a related art discussed by the present inventors et al. Then, problems associated with the configuration of coupling will be explained.

Figure 5:
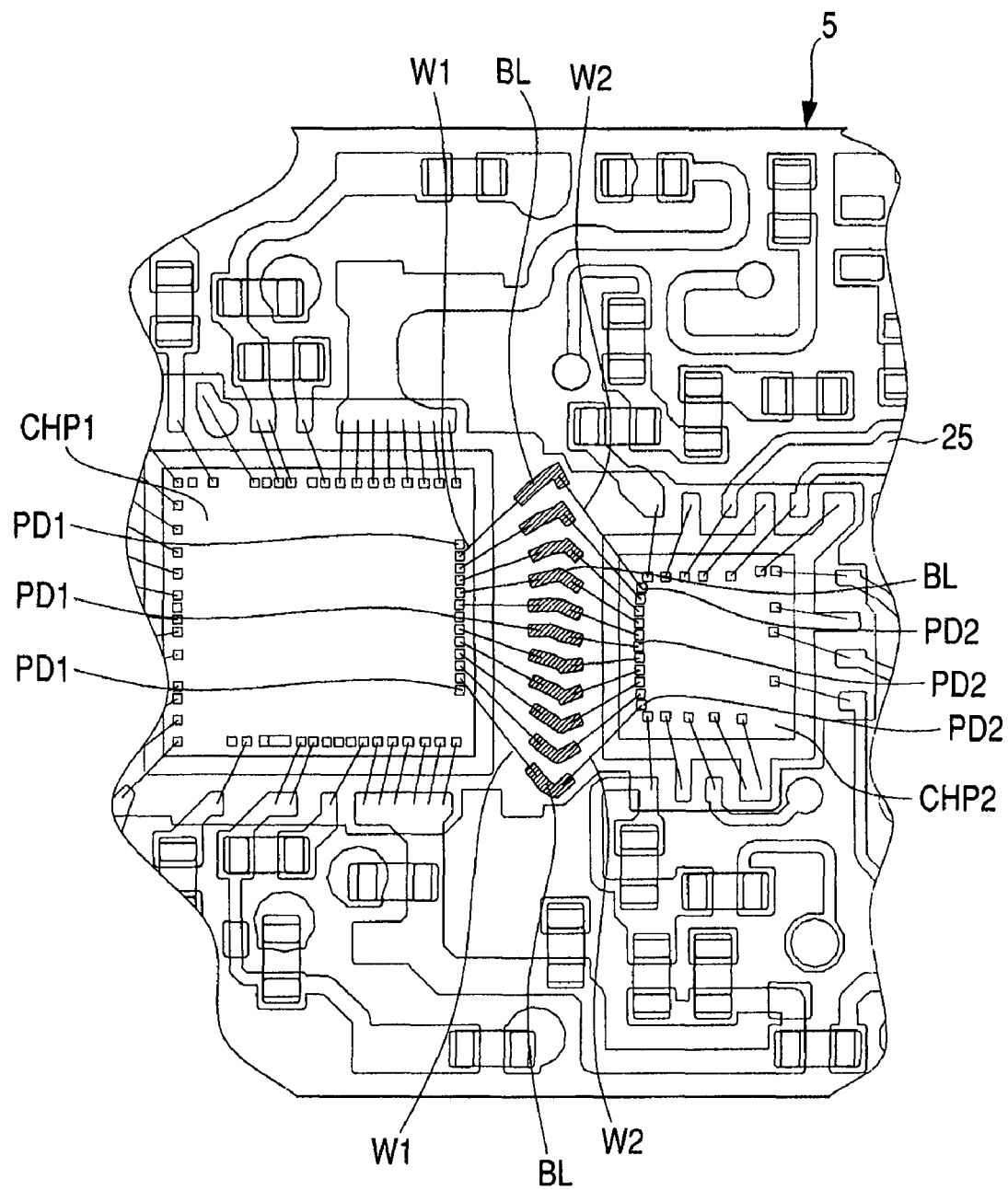
FIG. 5 is a diagram showing a relationship of coupling between semiconductor chips employed in an RF module according to a related art discussed by the present inventors et al.

FIG. 5 is a diagram showing the relationship of coupling between a semiconductor chip CHP1 and a semiconductor chip CHP2 according to a related art discussed by the present inventors et al. in an RF module 5. As shown in FIG. 5, pads PD1 are disposed on one side of the rectangular semiconductor chip CHP1 (side opposite to the semiconductor chip CHP2) along the one side thereof. The pads PD1 serve as external output terminals of a control circuit (switch control circuit). On the other hand, pads PD2 are disposed on one side (side opposite to the semiconductor chip CHP1) of the rectangular semiconductor chip CHP2 along the one side thereof. The pads PD2 serve as external output terminals electrically coupled to a gate electrode of a high electron mobility transistor that forms an antenna switch.

Bonding wires (corresponding to bonding lands) BL are formed over a wiring board 25 between the semiconductor chip CHP1 and the semiconductor chip CHP2. These bonding wires BL are disposed parallel to the side on which the pads PD1 of the semiconductor chip CHP1 are disposed, or the side on which the pads PD2 of the semiconductor chip CHP2 are disposed. The bonding wires BL are formed in the surface of the wiring board 25. The pads PD1 of the semiconductor chip CHP1 and the bonding wires BL are respectively coupled by wires W1, whereas the pads PD2 of the semiconductor chip CHP2 and the bonding wires BL are respectively coupled by wires W2.

There has recently been a tendency to increase the number of transmission lines and the number of reception lines both used in a cellular phone. This means that the number of antenna switches for performing switching between the transmission and reception lines increases. With the increase in the antenna switch, electrical coupling to the control circuit (switch control circuit) for controlling ON/OFF of the antenna switch becomes complex and increases in number. Accordingly, the bonding wires BL for coupling the pads PD1 of the semiconductor chip CHP1 and the pads PD2 of the semiconductor chip CHP2 both of which are shown in FIG. 5, also increase in number. Particularly when the control circuit formed in the semiconductor chip CHP1 controls the antenna switches formed in the semiconductor chip CHP2 in parallel, the number of the bonding wires BL for coupling the semiconductor chip CHP1 and the semiconductor chip CHP2 also increases. It is however considered that even when the control circuit formed in the semiconductor chip CHP1 controls the antenna switches formed in the semiconductor chip CHP2 in serial, the number of the bonding wires BL for coupling the semiconductor chip CHP1 and the semiconductor chip CHP2 increases with the increases in the transmission and reception lines.

Figure 6:
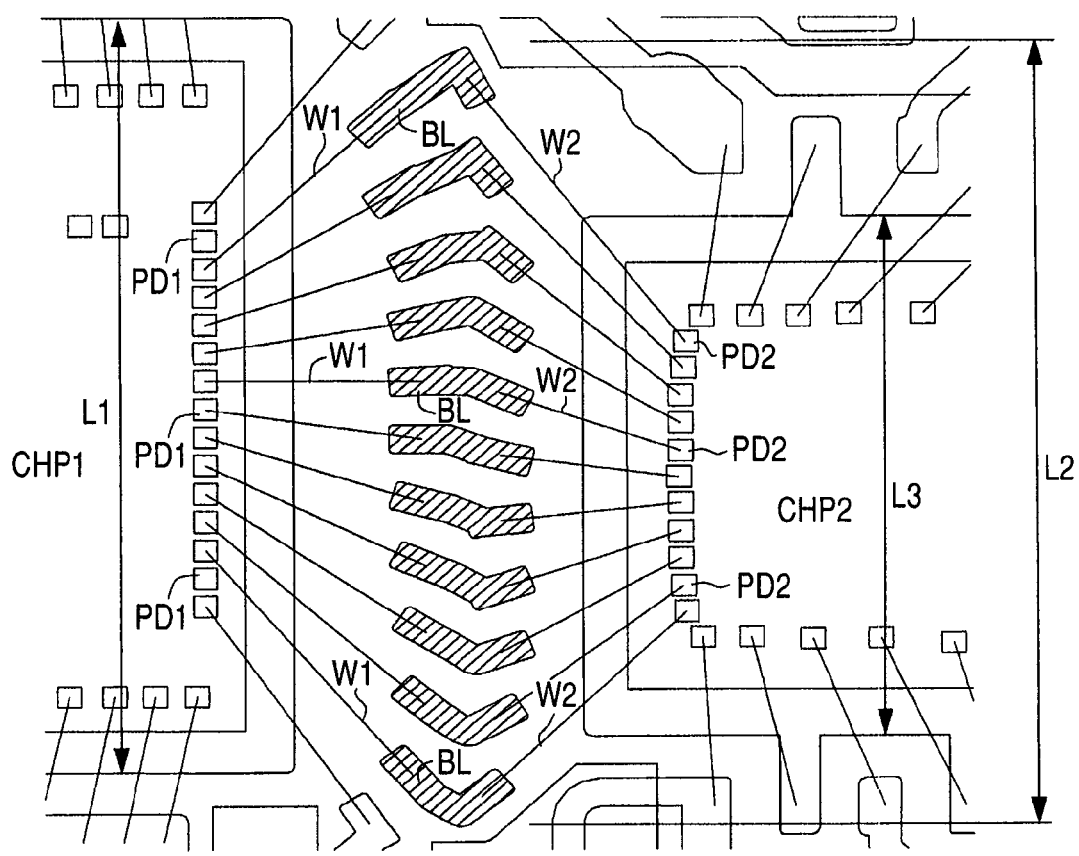
FIG. 6 is an enlarged view of an area between the semiconductor chips.

When the number of the bonding wires BL for coupling the semiconductor chip CHP1 and the semiconductor chip CHP2 increases, such a state as shown in FIG. 6 is reached. FIG. 6 is an enlarged view of an area defined between the semiconductor chip CHP1 and the semiconductor chip CHP2. Assume that in FIG. 6, the width of the semiconductor chip CHP1 is L1, the width in which a plurality of bonding wires BL are laid out is L2, and the width of the semiconductor chip CHP2 is L3. When, at this time, the number of the bonding wires BL increases, L2>L1>L3 is reached. That is, the width L2 in which the bonding wires BL are laid out side by side, becomes larger than the width L1 of the semiconductor chip CHP1. This means that the width L2 is extended out beyond the width of the semiconductor chip CHP1. Therefore, this width encroaches on the areas in which the output matching circuits 14a and 14b that configures the RF module shown in FIG. 5 are laid out, and the areas in which the low-pass filters 16a and 16b are laid out. Namely, there is a harm in attaining a size reduction of the RF module 5. However, this has not heretofore become a factor for a reduction in the number of parts mounted to the RF module and the restriction on the design freedom of the wiring board. Meanwhile, multifunctioning of the RF module 5 has recently been proceeded with the increases in the transmission and reception lines. Further, the low-pass filters 16a and 16b which have been formed outside the RF module up to now, are becoming the mounting thereof onto the RF module 5. Thus, the enlargement of the layout width L2 larger than one side (L1) of the semiconductor chip CHP1 is becoming manifest as a factor that encroaches on the matching circuit forming areas and low-pass filter forming areas of the RF module 5.

Figure 7:
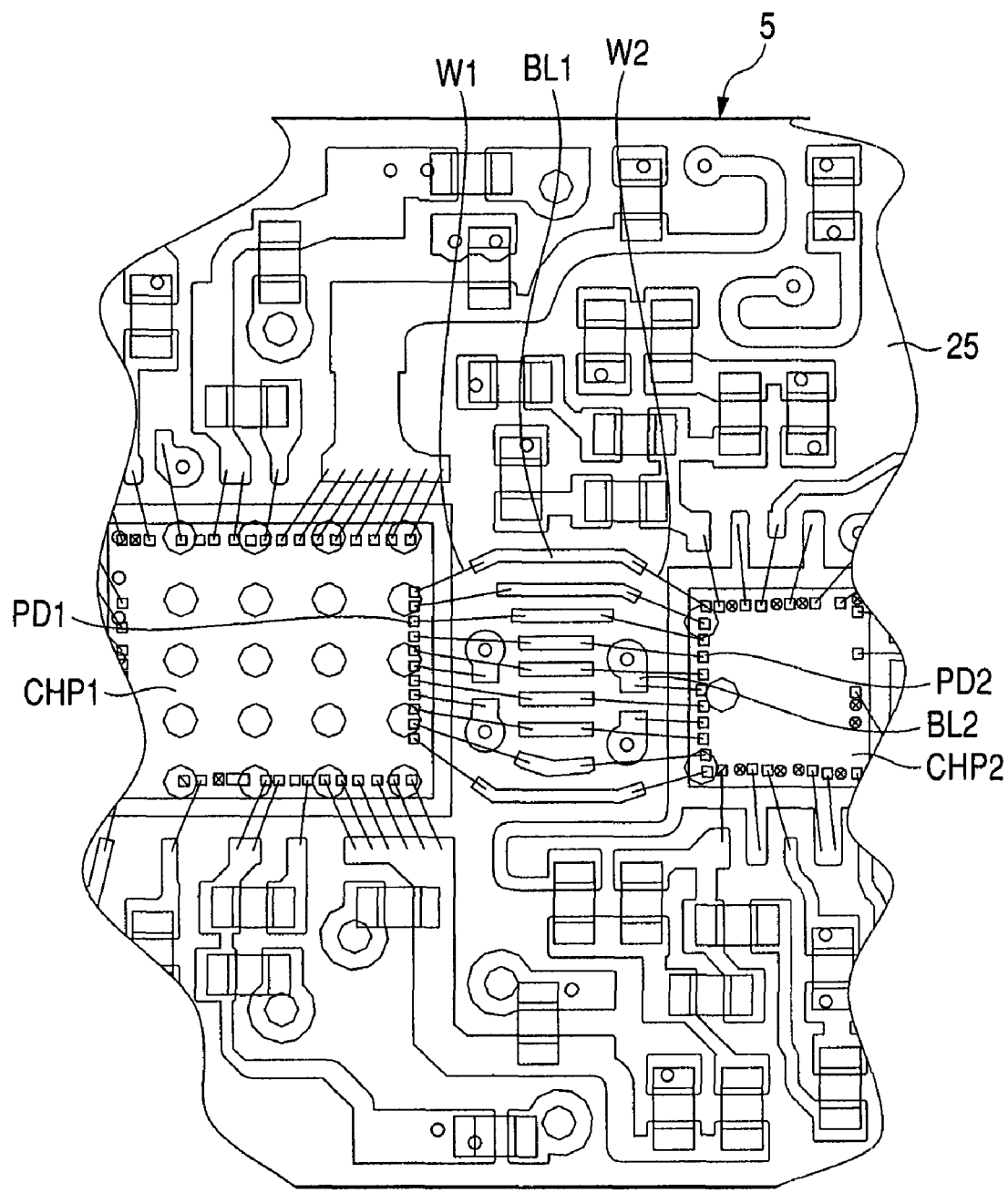
FIG. 7 is a diagram showing a mounting configuration of the RF module according to the first embodiment.

Therefore, the RF module 5 according to the first embodiment takes such a configuration as shown below. This point will be explained. FIG. 7 is a diagram showing the mounting configuration of the RF module 5 according to the first embodiment. In FIG. 7, the RF module 5 according to the first embodiment has a semiconductor chip CHP1 and a semiconductor chip CHP2 laid out so as to be aligned in a central part of a wiring board 25. The semiconductor chip CHP1 is formed with the control circuit 13 shown in FIG. 2. External coupling terminals of the control circuit 13 are pads PD1. The pads PD1 are disposed along one side (side opposite to the semiconductor chip CHP2) of the rectangular semiconductor chip CHP1. On the other hand, the semiconductor chip CHP2 is formed with the antenna switch 6 shown in FIG. 2. External coupling terminals of the antenna switch 6 are pads PD2. Described specifically, the antenna switch 6 is formed of a high electron mobility transistor. An external output terminal electrically coupled to a gate electrode of the high electron mobility transistor corresponds to the pad PD2.

Since the control circuit formed in the semiconductor chip CHP1 has the function of controlling the antenna switch formed in the semiconductor chip CHP2, the semiconductor chip CHP1 and the semiconductor chip CHP2 are electrically coupled to each other. Described specifically, the pads PD1 formed in the surface of the semiconductor chip CHP1 and the pads PD2 formed in the surface of the semiconductor chip CHP2 are coupled to one another. Respective electrical coupling between the pads PD1 and the pads PD2 are conducted by a plurality of bonding wires provided in the wiring board 25 lying between the semiconductor chip CHP1 and the semiconductor chip CHP2. That is, the bonding wires are formed in the wiring board 25 so as to be interposed between the first semiconductor chip CHP1 and the second semiconductor chip CHP2. Described in detail, a plurality of pads PD1 (first pads) are arranged at a first side of the first semiconductor chip CHP1, and a plurality of pads PD2 (second pads) are arranged at a second side of the second semiconductor chip CHP2. The arrangement of the pads PD1 and the arrangement of the pads PD2 are provided side by side so as to interpose the bonding wires therebetween.

Here, one feature of the first embodiment resides in that the bonding wires are configured by the bonding wires BL1 formed in the surface of the wiring board 25 and the bonding wires BL2 formed inside the wiring board 25. As one configuration of electrical coupling between each pad PD1 and each pad PD2, for example, the pad PD1 and the pad PD2 are electrically coupled by coupling the pad PD1 and its corresponding bonding wire BL1 formed in the surface layer of the wiring board 25 by means of a wire W1 and coupling the pad PD2 and its corresponding bonding wire BL1 formed in the surface layer of the wiring board 25 by means of a wire W2.

As another configuration of electrical coupling between each pad PD1 and each pad PD2, the pad PD1 and the pad PD2 are electrically coupled by coupling the pad PD1 and its corresponding bonging wire BL2 formed inside the wiring board 25 by means of a wire W1 and coupling the pad PD2 and its corresponding bonding wire BL2 formed inside the wiring board 25 by means of a wire W2. At this time, each bonding wire BL2 formed inside the wiring board 25 is coupled to a lead-out or drawing area formed in the surface of the wiring board 25 by each plug formed between the inside of the wiring board 25 and its surface. With the coupling of the wires W1 and W2 to the drawing area, the bonding wires BL2 formed inside the wiring board 25 and the wires W1 and W2 are electrically coupled to one another. When the bonding wires BL2 are mentioned in the present specification, the wires formed inside the wiring board 25, the plugs for coupling the inside of the wiring board 25 and its surface, and the drawing areas each coupled to the plug and formed in the surface of the wiring board 25 are referred to as the bonding wires BL2 together respectively.

By using the bonding wires BL2 formed inside the wiring board 25 as part of the electrical coupling between the pads PD1 and PD2 in this way, the number of the bonging wires BL1 formed in the surface of the wiring board 25 can be reduced. That is, when the pads PD1 and PD2 are coupled only by the bonding wires BL1 formed in the surface of the wiring board 25, the number of the bonding wires BL1 formed in the surface of the wiring board 25 increases, thus resulting in an increase in the exclusively-possessed area of each bonding wire BL1. On the other hand, the exclusively-possessed area of each of the bonding wires BL1 formed in the surface of the wiring board 25 can be reduced by utilizing each of the bonding wires BL2 formed inside the wiring board 25 as part of coupling between the pads PD1 and PD2. It is thus possible to sufficiently ensure a matching circuit forming area and a low-pass filter forming area in the RF module 5.

Figure 8:
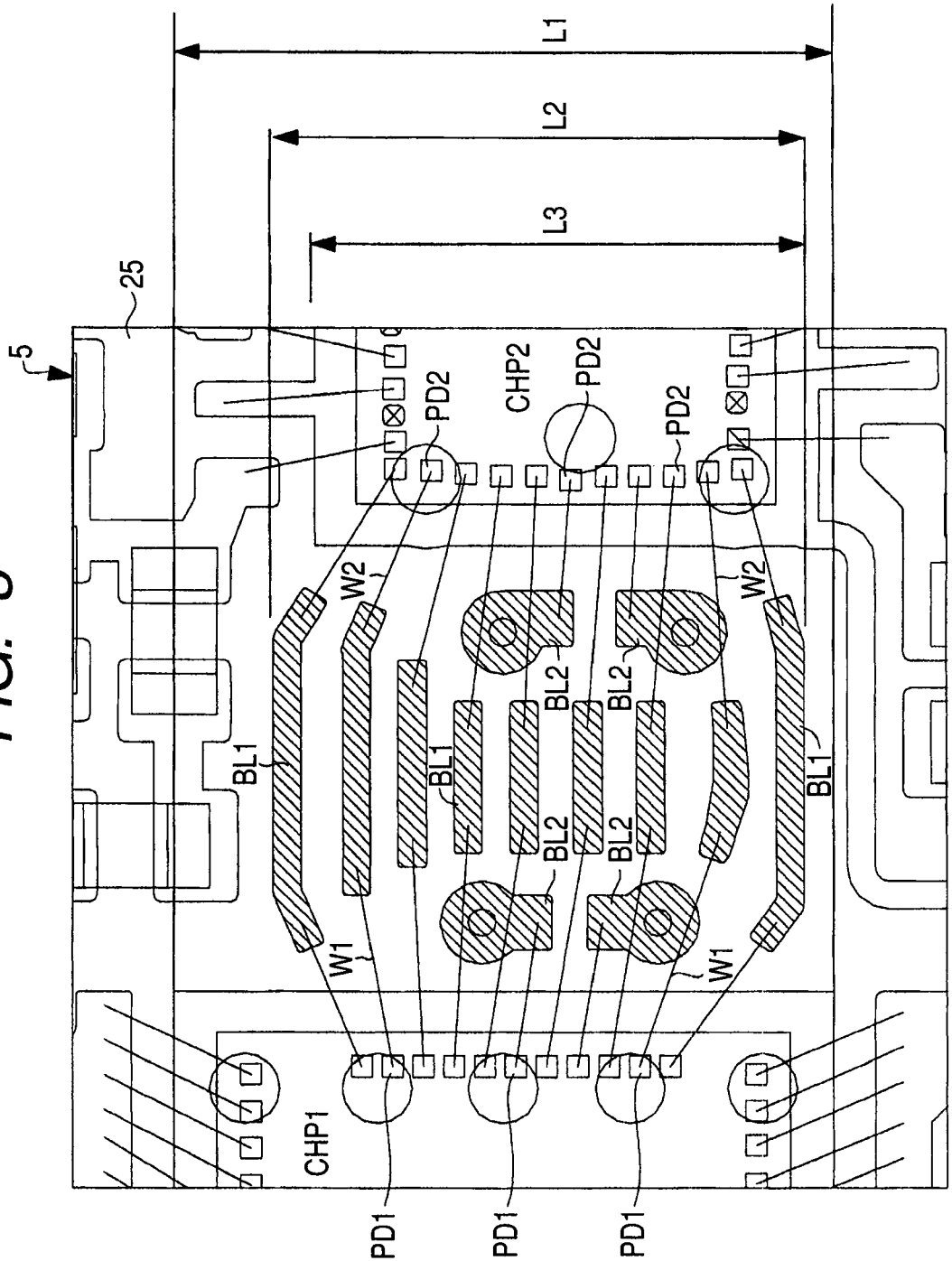
FIG. 8 is a diagram for describing that the exclusively-possessed areas of bonding wires formed in the surface of a wiring board can be reduced by using bonding wires formed inside the wiring board.

FIG. 8 is a diagram for describing that the exclusively-possessed area of each of the bonding wires BL1 formed in the surface of the wiring board 25 can be reduced by utilizing each of the bonding wires BL2 formed inside the wiring board 25. Assume that in FIG. 8, the width (width in the direction in which the pads PD1 formed in the semiconductor chip CHP1 are aligned) of the semiconductor chip is L1, the width in which the bonding wires BL1 are arranged or laid out, is L2 and the width (width in the direction in which the pads PD2 formed in the semiconductor chip CHP2 are aligned) of the semiconductor chip CHP2 is L3. At this time, the relationship of L1>L2>L3 has been established in the first embodiment. Namely, the number of the bonding wires BL1 formed in the surface of the wiring board 25 is reduced by carrying out part of electrical coupling between the pads PD1 and PD2 with the bonding wires BL2 formed inside the wiring board 25, thus resulting in L1>L2. From this point of view, the layout width L2 in which the bonding wires BL1 formed in the surface of the wiring board 25 are arranged or laid out, becomes not greater than the width L1 of the semiconductor chip CHP1. Hence the layout width L2 is not extended out beyond the width L1 of the semiconductor chip CHP1. It is therefore possible to sufficiently ensure an area for laying out each matching circuit that configures the RF module and an area for laying out each low-pass filter that configures the RF module even though the RF module is reduced in size. In other words, advantageous effects are obtained in that the exclusively-possessed area of each of the bonding wires BL1 formed in the surface of the wiring board 25 is reduced, and the layout area of each matching circuit that configures the RF module and the layout area of each low-pass filter that configures the RF module are not caused to encroach.

Figure 9:
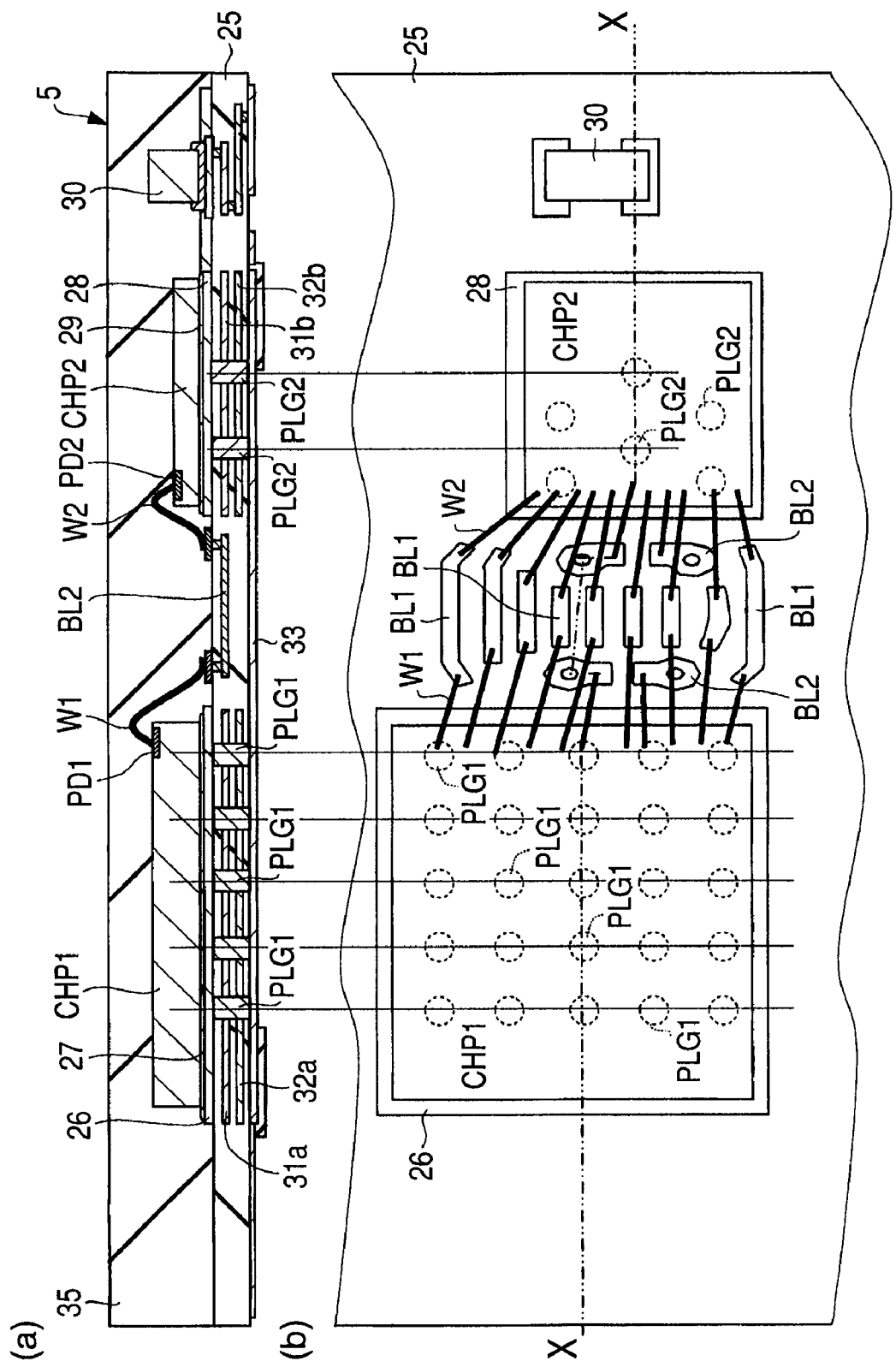

A description will next be made of a configuration wherein bonding wires BL2 are formed inside a wiring board 25 using a multilayered wiring structure of the wiring board 25. FIG. 9 is a plan view and a sectional view showing part of the wiring board 25 that configures an RF module. FIG. 9(b) is a plan view showing a chip mounting area of the wiring board 25, and FIG. 9(a) is a sectional view cut along line X-X of FIG. 9(b).

In FIG. 9(b), the RF module according to the first embodiment has the wiring board 25, semiconductor chips CHP1 and CHP2 mounted over the wiring board 25 side by side, and a passive component 30 mounted over the wiring board 25. The semiconductor chip CHP1 is formed over a die pad 26 corresponding to a first layer. Conductive plugs PLG1 are coupled to the die pad 26. Likewise, the semiconductor chip CHP2 is formed over a die pad 28 corresponding to a first layer. Conductive plugs PLG2 are coupled to the die pad 28.

Partial couplings between the semiconductor chip CHP1 and the semiconductor chip CHP2 are carried out by bonding wires BL1 and their corresponding wires W1 formed in the surface of the wiring board 25 and bonding wirings BL1 and their corresponding wires W2 formed therein. Further, partial couplings between the semiconductor chip CHP1 and the semiconductor chip CHP2 are carried out by the bonding wires BL2 and their corresponding wires W1 formed inside the wiring board 25 and the bonding wires BL2 and their corresponding wires W2 formed thereinside.

FIG. 9(a) is a sectional view cut along line X-X of FIG. 9(b). As shown in FIG. 9(a), the wiring board 25 is of, for example, a multilayered printed circuit or wiring board in which a plurality of insulator layers and a plurality of wiring layers are stacked over one another so as to be integrated into one. Although the insulator layers corresponding to three layers are laminated to form the wiring board 25 in FIG. 9(a), the number of the laminated insulator layers is not limited to it, and various changes can be conducted. As a material that forms the insulator layer of the wiring board, a ceramic material like, for example, alumina (aluminium oxide) or the like can be used. In this case, the wiring board 25 is of a ceramic multilayer board. The material for the insulator layer is not limited to the ceramic material, and various changes can be conducted. For instance, a glass epoxy resin or the like may be used.

As shown in FIG. 9(a), the die pad 26 corresponding to the first layer is formed over the surface of the wiring board 25. The semiconductor chip CHP1 is mounted over the die pad 26 via paste 27 interposed therebetween. Likewise, the die pad 28 corresponding to the first layer is formed over the surface of the wiring board 25. The semiconductor chip CHP2 is mounted over the die pad 28 via paste 29 interposed therebetween. Further, the passive component 30 is mounted over the surface of the wiring board 25. Each of the die pads 26 and 28 is comprised of, for example, a copper film. Incidentally, the surface of the wiring board 25 is sealed with a resin 35.

An internal configuration of the wiring board 25 will next be explained. As shown in FIG. 9(a), the plugs PLG1 that extend from the lower portion (die pad 26 corresponding to the first layer) of the semiconductor chip CHP1 to the back surface of the wiring board 25 are formed inside the wiring board 25. Further, the plugs PLG2 that extend from the lower portion (die pad 28 corresponding to the first layer) of the semiconductor chip CHP2 to the back surface of the wiring board 25 are formed thereinside. Here, the surface of the wiring board 25 will be called "first layer", and the inside of the wiring board 25 will be called "second layer, third layer and fourth layer" as the layer thereof progresses toward the inside of the wiring board 25.

Figure 10:
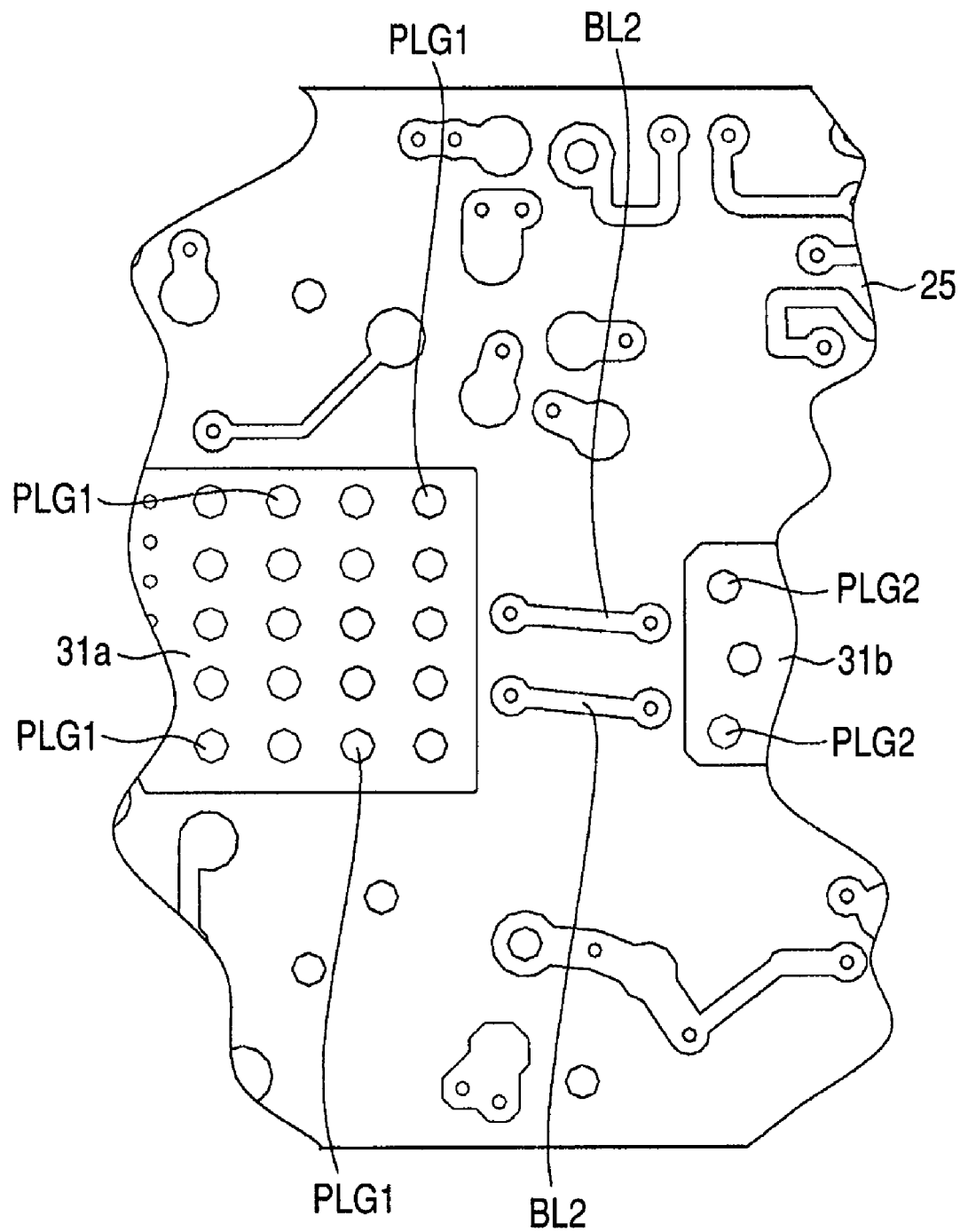
FIG. 10 is a plan view showing a second layer of the wiring board.

The second layer of the wiring board 25 will be explained. As shown in FIG. 9(a), a die pad 31a corresponding to the second layer is formed in a layer below the die pad 26 corresponding to the first layer. The die pad 31a is electrically coupled to the die pad 26 corresponding to the first layer by the plugs PLG1. Likewise, a die pad 31b corresponding to the second layer is formed in a layer below the die pad 28 corresponding to the first layer. The die pad 31b is electrically couple to the die pad 28 by the plugs PLG2. Further, the bonding wires BL2 for coupling the semiconductor chip CHP1 and the semiconductor chip CHP2 are disposed between the die pad 31a and the die pad 31b. The bonding wires BL2 are coupled to their corresponding pads PD1 of the semiconductor chip CHP1 by the wires W1. The bonding wires BL2 are coupled to their corresponding pads PD2 of the semiconductor chip CHP2 by the wires W2. FIG. 10 is a plan view showing the second layer of the wiring board 25. It is understood that as shown in FIG. 10, the die pad 31*a* corresponding to the second layer and the die pad 31*b* corresponding to the second layer are formed in the second layer of the wiring board 25, and the plural bonding wires BL2 are formed between the die pad 31*a* corresponding to the second layer and the die pad 31*b* corresponding to the second layer. It is also understood that the plural plugs PLG1 extend through the inside of the die pad 31*a* corresponding to the second layer, and the plural plugs PLG2 extend through the inside of the die pad 31*b* corresponding to the second layer.

The third layer of the wiring board 25 will be explained. As shown in FIG. 9(*a*), a pad 32*a* corresponding to the third layer is formed in a layer below the die pad 31*a* corresponding to the second layer. The die pad 32*a* corresponding to the third layer is electrically coupled to the die pad 26 corresponding to the first layer by the plugs PLG1. Likewise, a die pad 32*b* corresponding to the third layer is formed in a layer below the die pad 31*b* corresponding to the second layer. The die pad 32*b* is electrically coupled to the die pad 28 corresponding to the first layer by the plural plugs PLG2.

The fourth layer of the wiring board 25 will be explained. The fourth layer of the wiring board 25 corresponds to the back surface of the wiring board 25. As shown in FIG. 9(*a*), a wire or wiring 33 is formed over the back surface of the wiring board 25. The wire 33 is electrically coupled to the die pad 26 by the plugs PLG1. Likewise, the wire 33 is electrically coupled to the die pad 28 by the plugs PLG2. Incidentally, the plugs PLG1 and PLG2 respectively have the function of electrically coupling between the multilayer wiring layers formed in the wiring board 25 and also function as thermal vias that transfer heat generated in the semiconductor chip CHP1 and the semiconductor chip CHP2 to the back surface of the wiring board 25 thereby to enhance the efficiency of heat radiation.

It is understood that as described above, the bonding wires BL2 can be formed inside (second layer) of the wiring board 25 using the multilayered wiring structure of the wiring board 25.

Figure 11:
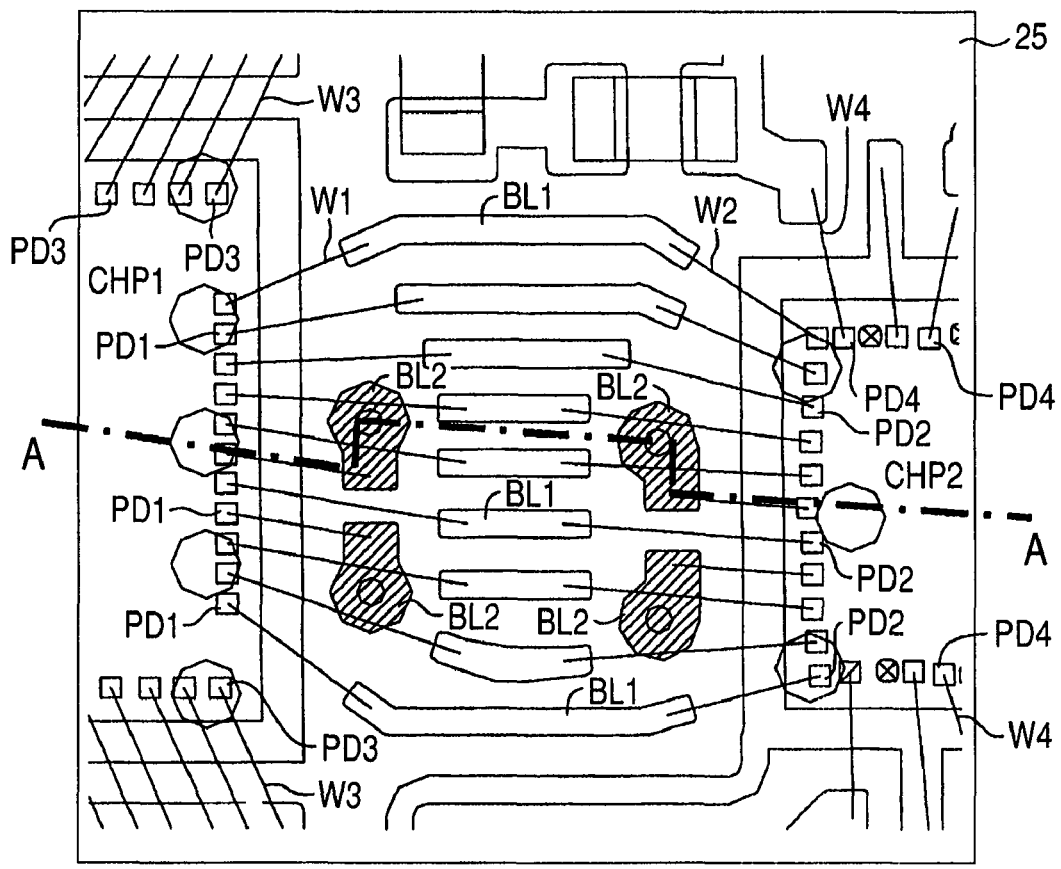
FIG. 11 is an enlarged view of a coupling area between the corresponding semiconductor chips mounted on the wiring board of the RF module.

FIG. 11 is an enlarged view of a coupling area between the semiconductor chips CHP1 and CHP2 mounted on the wiring board 25 of the RF module. As shown in FIG. 11, the pads PD1 of the semiconductor chip CHP1 and the pads PD2 of the semiconductor chip CHP2 are coupled by their corresponding bonding wires BL1 formed in the surface of the wiring board 25 and their corresponding bonding wires BL2 formed inside the wiring board 25. The pads PD1 are external coupling terminals coupled to the control circuit, and the pads PD2 are external coupling terminals coupled to the gate electrode of the high electron mobility transistor that configures the antenna switch. Thus, the bonding wires BL1 and BL2 for coupling the pads PD1 and PD2 respectively function as wirings or wires for supplying signals for controlling the antenna switch from the control circuit and supplying a source voltage to the antenna switch therefrom. Here, the bonding wires BL1 are formed in the surface of the wiring board 25, and the bonding wires BL2 are formed inside the wiring board 25. In consideration of this point, a description will be made of, for example, what signals are preferably transferred to the bonding wires BL2 formed inside the wiring board 25 in terms of an improvement in the characteristic of the RF module.

<Type of Signal Using Bonding Wire>

As shown in FIG. 11, signals for controlling the antenna switch formed in the semiconductor chip CHP2 are transmitted from the control circuit formed in the semiconductor chip CHP1 to the bonding wires BL1 and BL2 for coupling between the pads PD1 and PD2. That is, the bonding wires BL1 and the bonding wires BL2 are wires or wirings for transferring the signals sent from the first semiconductor chip CHP1 to the second semiconductor chip CHP2. Described specifically, a signal for supplying a source voltage to the antenna switch, and a switch changeover control signal for performing transmission-line switching, or a switch changeover control signal for performing reception-line switching are contained therein.

Here, a signal amplified by the corresponding amplifier circuit of the semiconductor chip CHP1 is outputted from each of pads PD3 shown in FIG. 11 to a matching circuit (not shown) and a low-pass filter (not shown) formed in the wiring board 25 via each of wires W3. The amplified signal that has passed through the corresponding matching circuit and low-pass filter is inputted from each of pads PD4 to the semiconductor chip CHP2 via each of wires W4. Then, the amplified signal is outputted from the semiconductor chip CHP2 to the antenna.

Thus, when a radio wave from a cellular phone is transmitted, the amplified signal is transferred to the wires W3 and W4. When, at this time, there is a signal transferred to each bonding wire BL1 formed in the surface of the wiring board 25, coupling occurs between each of the wires W3 or W4 and its corresponding bonding wire BL1, and noise is hence applied to the signal transferred to the corresponding bonding wire BL. When the switch changeover control signal for controlling the selector switch for performing the transmission-line switching is transferred to each of the bonding wires BL1 formed in the surface of the wiring board 25, for example, the amplified signal is transferred to the wires W3 and W4. Therefore, coupling is apt to occur and noise is applied to the switch changeover control signal. When noise is applied to the switch changeover control signal, there is a fear that the normal switching of selector switch is not performed due to the influence of noise. In doing so, the amplified signal is in danger of being not transmittable from the antenna normally. Even when the signal for supplying the source voltage to the antenna switch is transferred to each of the bonding wires BL1 formed in the surface of the wiring board 25, coupling is apt to occur between each of the wires W3 and W4 and its corresponding bonding wire BL1 upon transmission. That is, when there is the signal transferred through each of the bonding wires BL1 upon execution of transmission for performing the transfer of the amplified signal to the wires W3 and W4, the wires W3 and W4 and the bonding wires BL1 exist in the surface of the same wiring board 25, so that they are susceptible to coupling, thus causing a factor for degradation of the reliability of the RF module.

Therefore, in the first embodiment, the signal outputted from the pad PD1 (control circuit) to the pad PD2 (antenna switch) is transferred through each of the bonding wires BL2 formed inside the wiring board 25 without through each of the bonding wires BL1 formed in the surface of the wiring board 25 upon the transmission for performing the transfer of the amplified signal to the wires W3 and W4. Owing to such a configuration, the coupling between each of the wires W3 and W4 and its corresponding bonding wire BL2 can be reduced.

Figure 12:
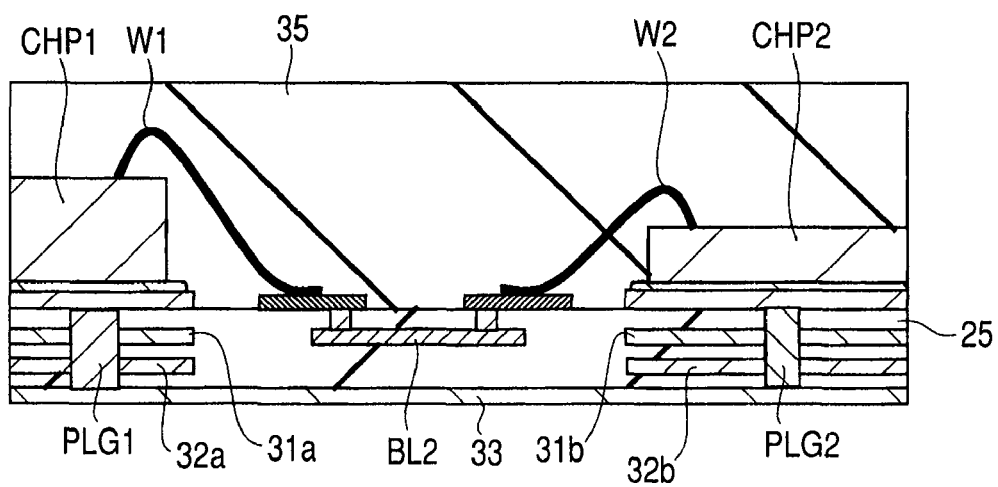
FIG. 12 is a sectional view cut along line A-A of FIG. 11.
Figure 13:
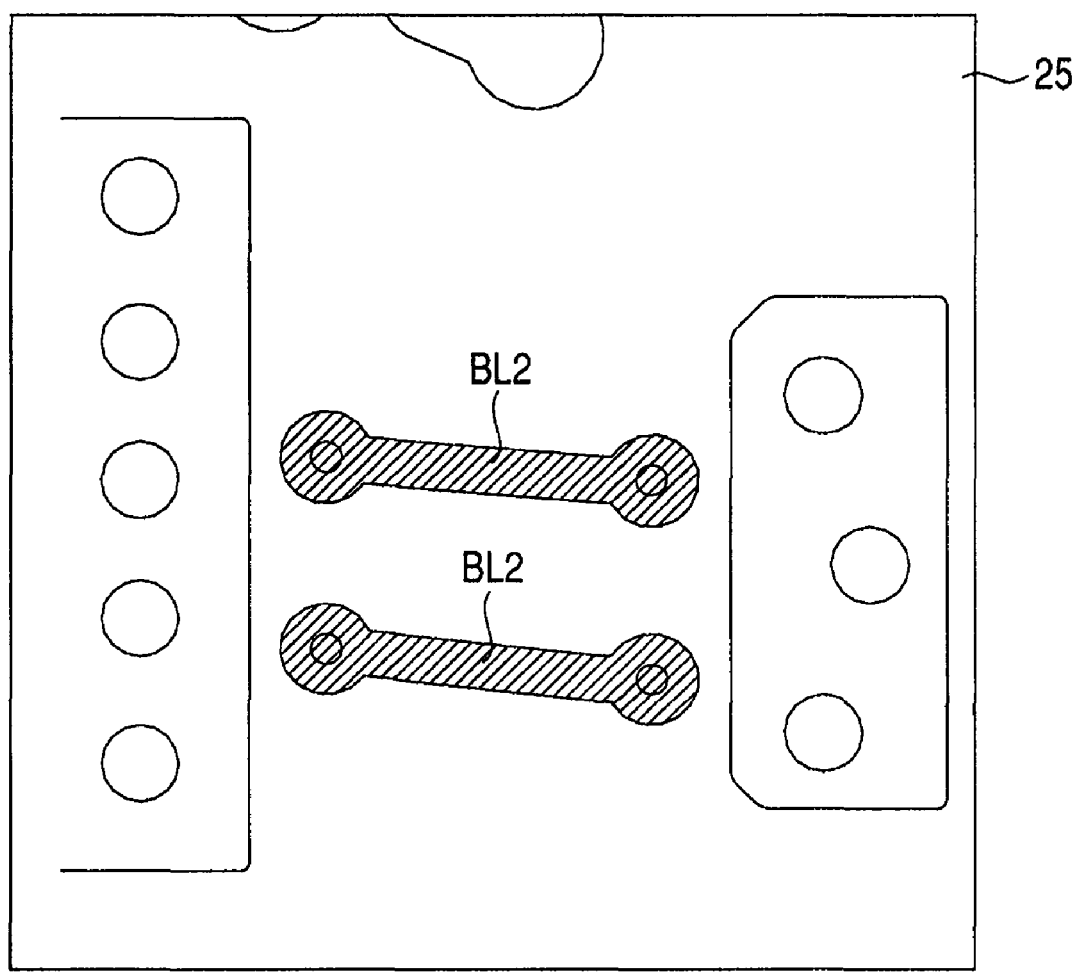
FIG. 13 is a plan view illustrating patterns of bonding wires formed inside the wiring board.

FIG. 12 is a sectional view cut along line A-A of FIG. 11. As shown in FIG. 12, the bonding wires BL2 are formed inside the wiring board 25. Accordingly, the periphery of each bonding wire BL2 takes such a structure that it is covered with an insulating layer. It is therefore possible to reduce coupling between each of the wires W3 and W4 formed in the surface of the wiring board 25 and each of the bonding wires BL2 formed therein. Described specifically, it is desirable that the signal for supplying the source voltage to the antenna switch and the switch changeover control signal for performing the transmission-line switching are transferred to the bonding wires BL2 formed inside the wiring board 25. FIG. 13 is a plan view showing patterns of the bonding wires BL2 formed inside the wiring board 25. With the formation of the bonding wires BL2 in a plural fashion as shown in FIG. 13, the bonding wires BL2 can be used in the transfer of both the signal for supplying the source voltage to the antenna switch and the switch changeover control signal for performing the transmission-line switching.

On the other hand, each of the bonding wires BL1 formed in the surface of the wiring board 25 can be used for each signal transferred when it is not necessary to transfer the amplified signal to the wires W3 and W4. Described specifically, it is of a signal used upon reception of a radio wave without being used upon its transmission. As its signal, there may be mentioned, for example, a switch changeover control signal for performing switching between a plurality of reception lines, or the like.

Incidentally, although the first embodiment has explained the signal transferred from each of the pads PD1 of the semiconductor chip CHP1 to each of the pads PD2 of the semiconductor chip CHP2, the present invention can be applied even to a signal transferred from the pad PD2 of the semiconductor chip CHP2 to the pad PD1 of the semiconductor chip CHP1.

The present invention can be applied to, for example, a case in which a directional coupler (coupler) for detecting the power of the amplified signal is formed in the semiconductor chip CHP2 that forms the antenna switch. Although the directional coupler is formed over the wiring board 5 in the configuration under the present state, the directional coupler is considered to be provided in the semiconductor chip CHP2 forming the antenna switch in association with a further size reduction in the RF module. In this case, the power detected by the direction coupler is converted into a voltage by the detection circuit, which is followed by being inputted to the control circuit provided in the semiconductor chip CHP1. Thus, when the detection circuit is formed in either the semiconductor chip CHP1 or the semiconductor chip CHP2, a detection signal transferred from each of the pads PD2 of the semiconductor chip CHP2 to each of the pads PD1 of the semiconductor chip CHP1 exists. In particular, the detection signal is used in feedback control of the control circuit in such a manner than the power of the signal amplified by the corresponding amplifier circuit becomes constant. That is, the detection signal is used when the amplified signal is being transmitted to each of the wires W3 and W4 (upon its transmission). Therefore, the influence of coupling can be reduced by carrying out the transfer of the detection signal by the bonding wires BL2 formed inside the wiring board 25.

It is understood that when the bonding wires BL2 formed inside the wiring board 25 are used in the transfer of each signal that needs to be outputted from the semiconductor chip CHP1 to the semiconductor chip CHP2 in addition to the amplified signal upon transmission of the radio wave, the occurrence of noise due to the coupling can be suppressed effectively.

However, it is also considered that the transfer of the signals that need to be outputted from the semiconductor chip CHP1 to the semiconductor chip CHP2 in addition to the amplified signal cannot be performed all by the bonding wires BL2 upon the transmission of the radio wave. In this case, the boding wires BL1 formed in the surface of the wiring board 25 are also used in the transfer of each signal that needs to be outputted from the semiconductor chip CHP1 to the semiconductor chip CHP2 in addition to the amplified signal upon transmission of the radio wave. Although the influence of coupling is a concern in this case, a description will be made of such a configuration that the influence of the coupling can be reduced if possible.

<Configuration that Enables Reduction in the Influence of Coupling>

Figure 14:
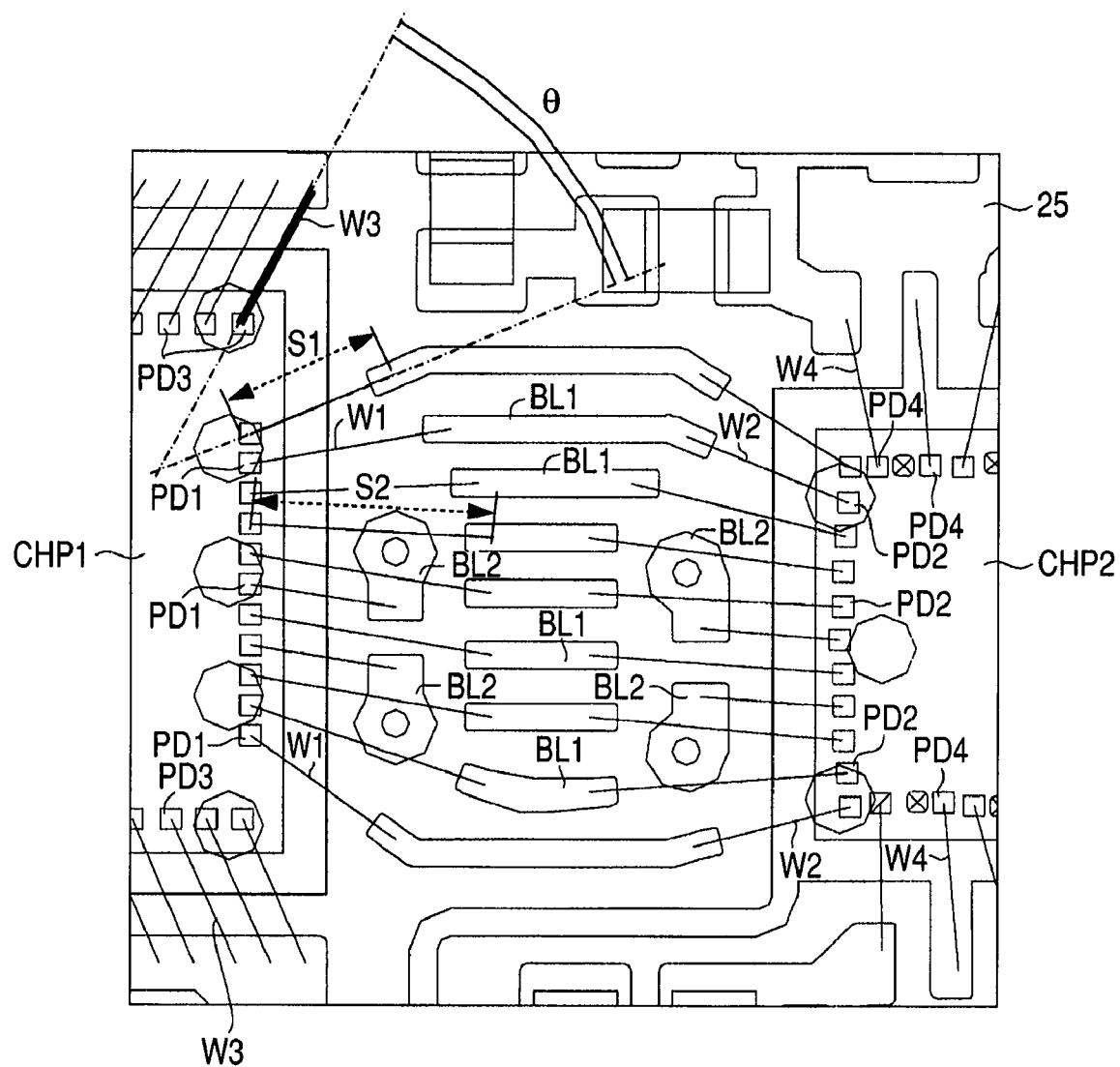
FIG. 14 is a diagram showing a configuration in which the influence of coupling between wires for coupling bonding wires and pads and wires for transmitting amplified signals can be reduced.

FIG. 14 is a diagram showing a configuration that enables a reduction in the influence of coupling between each of the wires W1 for coupling the bonding wires BL1 and the pads PD1 and each of the wires W3 for transferring the amplified signal. Of the couplings between the respective wires, the coupling between the wires W3 and W1 is more important than the coupling between the wire W3 and the bonding wire BL1. Therefore, the first embodiment will propose such a configuration that the coupling between the wires W3 and W1 can be reduced.

As shown in FIG. 14, the plural bonding wires BL1 are disposed parallel to one side of the semiconductor chip CHP1, which corresponds to the direction in which the pads PD1 are arranged. The length S1 of the wire W1 coupled to the bonding wire BL1 disposed on the end side of the semiconductor chip CHP1 is shorter than the length S2 of the wire W1 coupled to the bonding wire BL1 disposed on the center side of the semiconductor chip CHP1. It is thus possible to reduce the coupling between the wire W1 disposed on the end side of the semiconductor chip CHP1 and the wire W3 for transferring the amplified signal. That is, the influence of the coupling between the respective wires becomes larger as the distance between the wires becomes shorter. Thus, since the wire W1 disposed on the end side of the semiconductor chip CHP1 rather than each wire W1 disposed on the central side of the semiconductor chip CHP1 is close to the wire W3, the coupling between the wires W1 and W3 disposed on the end side of the semiconductor chip CHP1 becomes a problem. Here, the influence of coupling between the wires becomes large as the length of each individual wire becomes longer. Therefore, the length S1 of the wire W1 disposed on the end side of the semiconductor chip CHP1 is made short, thereby making it possible to reduce the coupling between the wires W1 and W3 disposed on the end side of the semiconductor chip CHP1.

Since the distance between the semiconductor chip CHP1 and the semiconductor chip CHP2 remains unchanged, the shortening of the length S1 of the wire W1 disposed on the end side of the semiconductor chip CHP1 than the length S2 of the wire W1 disposed on the central side of the semiconductor chip CHP1 means that in other words, the length of the bonding wire BL1 disposed on the end side of the semiconductor chip CHP1 is made longer than the length of each bonding wire BL1 disposed on the central side of the semiconductor chip CHP1.

A description will subsequently be made of an angle formed between the wire W1 disposed on the end side of the semiconductor chip CHP1 and its corresponding wire W3 through which the amplified signal is transferred. In the related art, only the bonding wires formed in the surface of the wiring board are used as for the bonding wires for coupling between the pads PD1 and PD2. At this time, such a state as shown in FIG. 6 is reached as the number of the bonding wires BL for coupling the semiconductor chip CHP1 and the semiconductor chip CHP2 increases. FIG. 6 is an enlarged view of the area defined between the semiconductor chip CHP1 and the semiconductor chip CHP2. Assume that in FIG. 6, the width of the semiconductor chip CHP1 is L1, the width in which the plural bonding wires BL are laid out is L2, and the width of the semiconductor chip CHP2 is L3. When, at this time, the number of the bonding wires BL increases, L2>L1>L3 is reached. That is, the width L2 in which the bonding wires BL are laid out side by side, becomes larger than the width L1 of the semiconductor chip CHP1. This means that the width L2 is extended out beyond the width of the semiconductor chip CHP1. In this case, the angle which the wire W1 disposed on the end side of the semiconductor chip CHP1 forms with the wire through which the amplified signal is transmitted, becomes small, so they reach a parallel state. As the wire W1 and the wire both disposed on the end side of the semiconductor chip CHP1 becomes close to the parallel state, the influence of coupling increases.

On the other hand, assume that in the first embodiment as shown in FIG. 8, the width (width in the direction in which the pads PD1 formed in the semiconductor chip CHP1 are aligned) of the semiconductor chip is L1, the width in which the bonding wires BL1 are arranged or laid out, is L2 and the width (width in the direction in which the pads PD2 formed in the semiconductor chip CHP2 are aligned) of the semiconductor chip CHP2 is L3. At this time, the relationship of L1>L2>L3 has been established in the first embodiment. Namely, the number of the bonding wires BL1 formed in the surface of the wiring board 25 is reduced by carrying out part of electrical coupling between the pads PD1 and PD2 with the bonding wires BL2 formed inside the wiring board 25, thus resulting in L1>L2. From this point of view, the layout width L2 in which the bonding wires BL1 formed in the surface of the wiring board 25 are arranged or laid out, becomes not greater than the width L1 of the semiconductor chip CHP1. Hence the layout width L2 is not extended out beyond the width L11 of the semiconductor chip CHP1.

As shown in FIG. 14 from the above, the angle θ formed between the wire W1 disposed on the end side of the semiconductor chip CHP1 and the wire W3 through which the amplified signal is transmitted, becomes large, so that the relationship of position between the wire W1 disposed on the end side of the semiconductor chip CHP1 and the wire W3 through which the amplified signal is transmitted, approaches from a parallel state to an orthogonal state. When the angle θ formed between the wire W1 disposed on the end side of the semiconductor chip CHP1 and the wire W3 through which the amplified signal is transmitted, approaches 90°, the influence of coupling therebetween is greatly reduced. According to the first embodiment, part of electrical coupling between the pads PD1 and PD2 is carried out by each of the bonding wires BL2 formed inside the wiring board 25. Thus, the number of the bonding wires BL1 formed in the surface of the wiring board 25 can be reduced, so that the angle θ formed between the wire W1 disposed on the end side of the semiconductor chip CHP1 and the wire W3 through which the amplified signal is transmitted, can be set to a range of 45° or more to 130° or less, thereby making it possible to reduce the influence of coupling greatly.

Although a description has been made above of the relationship between each of the wires W1 for coupling the semiconductor chip CHP1 and the bonding wires BL1 and each of the wires W3 for transmitting the amplified signal from the semiconductor chip CHP1 to the matching circuit, it can be said that the relationship between each of the wires W2 for coupling the semiconductor chip CHP2 and the bonding wires BL1 and each of the wires W4 for transmitting the amplified signal from the matching circuit (low-pass filter) to the semiconductor chip CHP2 is also similar to the above. That is, the length of the wire W2 disposed on the end side of the semiconductor chip CHP2 is shortened, thereby making it possible to reduce the coupling between the wires W2 and W4 disposed on the end side of the semiconductor chip CHP2. Further, the bonding wires BL2 are formed inside the wiring board 25, thereby making it possible to reduce the number of the bonding wires BL1 formed in the surface of the wiring board 25. As a result, the angle θ formed between the wire W2 disposed on the end side of the semiconductor chip CHP2 and the wire W4 through which the amplified signal is transmitted, can be set to a range of 45° or more to 135° or less, thus making it possible to reduce the influence of the coupling therebetween greatly.

In the first embodiment, the coupling between the wires W1 and W3 disposed on the end side of the semiconductor chip CHP1 can be reduced by shortening the length of the wire W1 disposed on the end side of the semiconductor chip CHP1. In order to shorten the length of the wire W1 disposed on the end side of the semiconductor chip CHP1 assuming that the number of the bonding wires BL1 formed in the surface of the wiring board 25 can be reduced by forming the bonding wires BL2 inside the wiring board 25, there is a need to devise a layout configuration between the bonding wires BL2 and the bonding wires BL1 as shown below.

<Layout Configuration Between Bonding Wires BL1 and Bonding Wires BL2>

Figure 15:
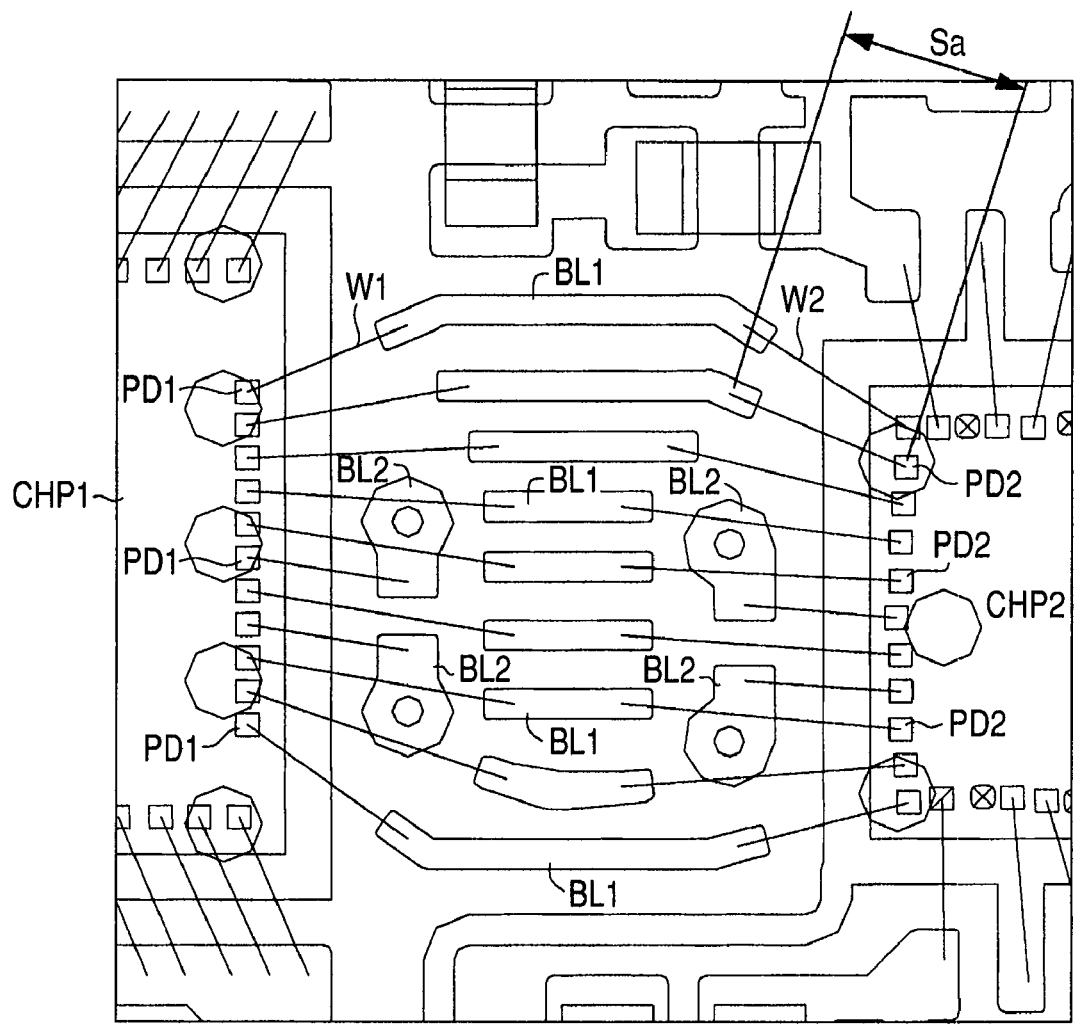
FIG. 15 is an enlarged view of a coupling area between the corresponding semiconductor chips mounted on the wiring board of the RF module.

FIG. 15 is an enlarged view of a coupling area between the semiconductor chips CHP1 and CHP2 mounted over the wiring board of the RF module. As shown in FIG. 15, a plurality of the bonding wires BL1 are arranged so as to be parallel to a first side of the semiconductor chip CHP2, which corresponds to the direction in which the pads PD2 are arranged. The length Sa of the wire W2 coupled to the bonding wire BL1 disposed on the end side of the semiconductor chip CHP2 is set shorter than the length of the wire W2 coupled to each bonding wire BL1 disposed on the central side of the semiconductor chip CHP2. The bonding wires BL2 formed inside the wiring board 25 are formed on the center side of the semiconductor chip CHP2, but not disposed on the end side of the semiconductor chip CHP2. With such a configuration, the length Sa of the wire W2 coupled to the bonding wire BL1 disposed on the end side of the semiconductor chip CHP2 can be shortened.

Figure 16:
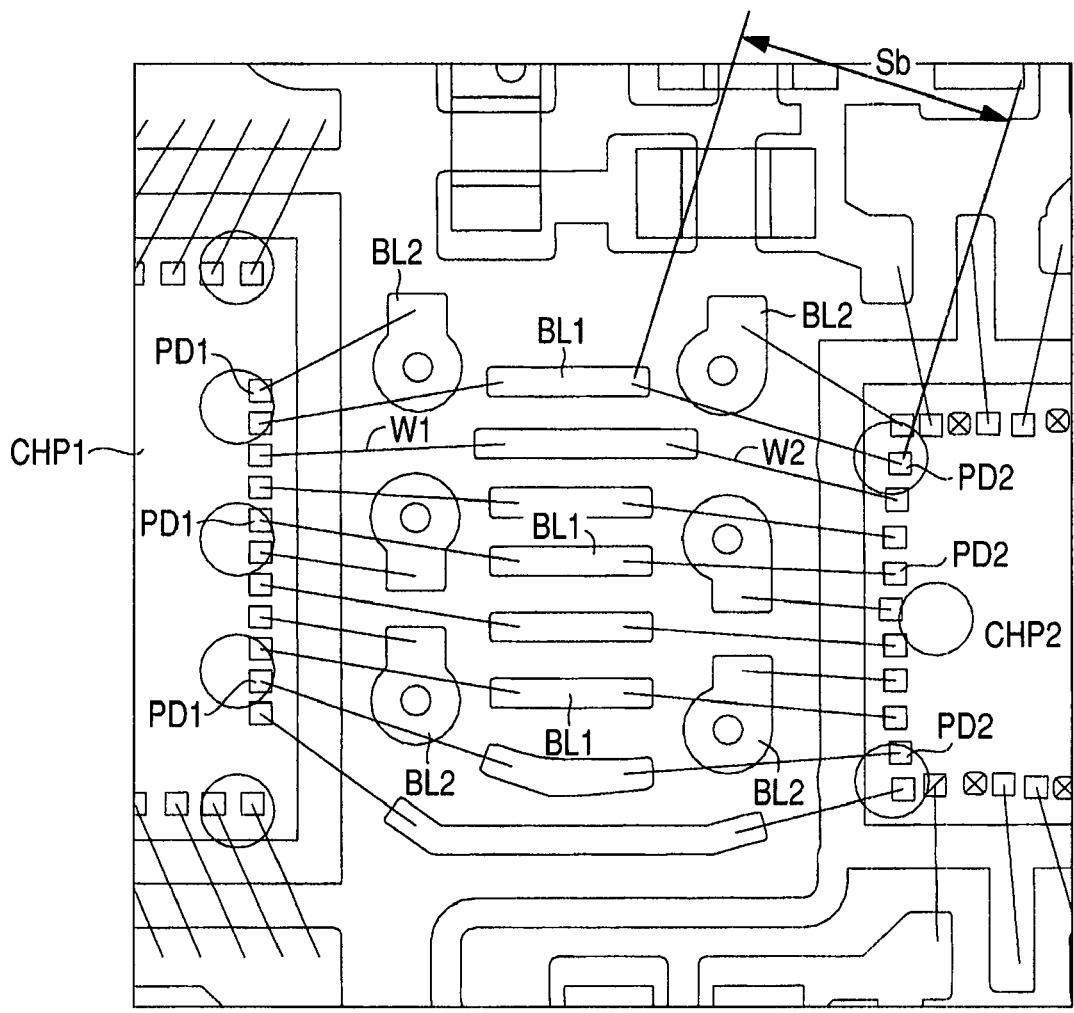
FIG. 16 is an enlarged view of a coupling area between the corresponding semiconductor chips mounted on the wiring board of the RF module.

When the bonding wire BL2 is formed not only on the center side of the semiconductor chip CHP2 but also on the end side of the semiconductor chip CHP2 as shown in FIG. 16, for example, it is difficult to make the length of the bonding wire BL1 disposed on the end side of the semiconductor chip CHP2 longer. As a result, the length Sb of the wire W2 for coupling the bonding wire BL1 disposed on the end side of the semiconductor chip CHP2 and its corresponding pad PD2 becomes long. Therefore, this layout configuration is susceptible to coupling.

It is thus understood that although the bonding wires BL2 formed inside the wiring board 25 are formed on the central side of the semiconductor chip CHP2, the layout of the bonding wire BL2 on the end side of the semiconductor chip CHP2 is preferably avoided in terms of a reduction in coupling.

Figure 17:
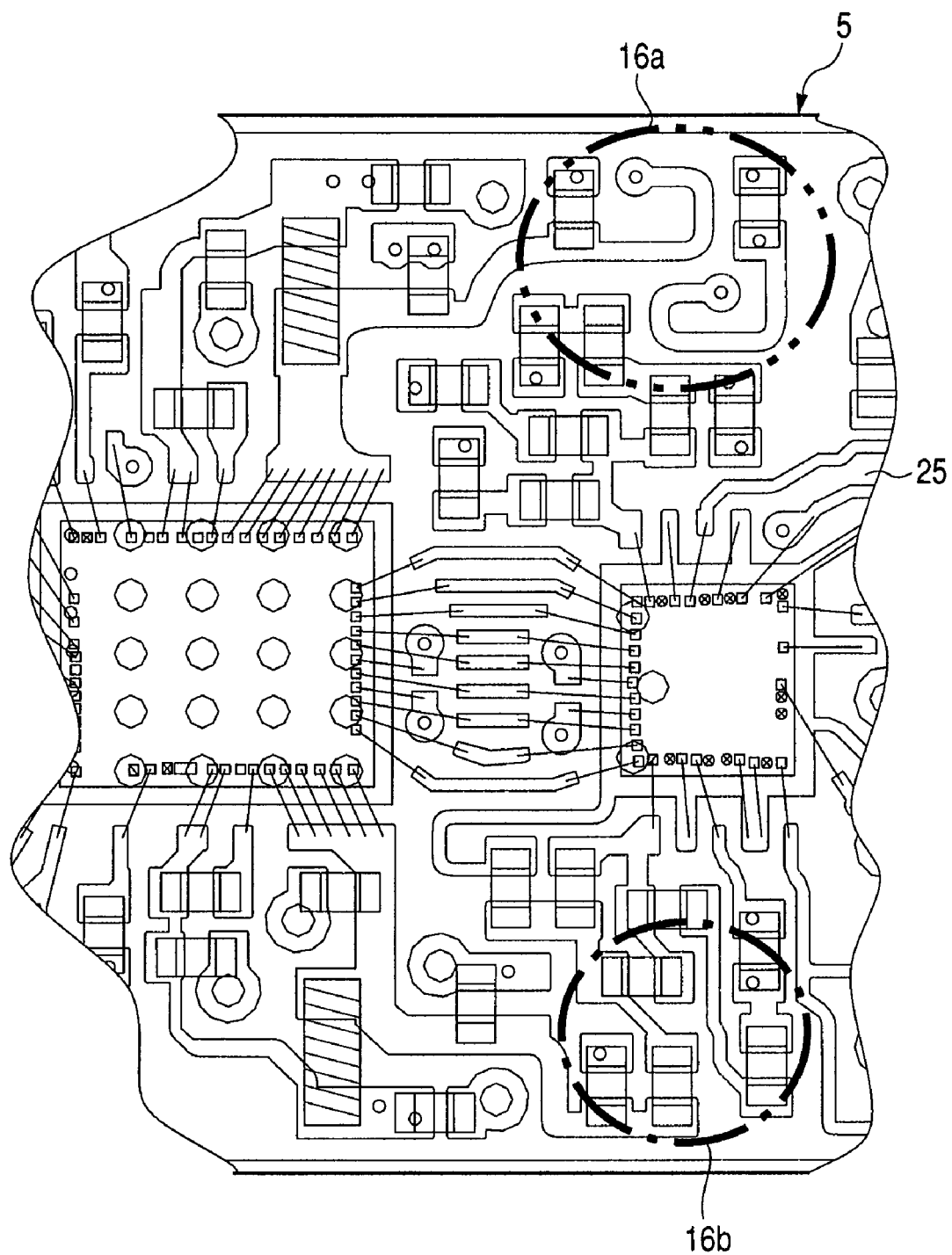
FIG. 17 is a diagram showing a configuration of the RF module according to the first embodiment and is a diagram illustrating layout positions of low-pass filters in particular.

A description will next be made of another reason that the bonding wire BL2 formed inside the wiring board 25 is not disposed on the end side of the semiconductor chip CHP2. FIG. 17 is a diagram showing a configuration of the RF module 5 according to the first embodiment. As shown in FIG. 17, the semiconductor chip CHP1 and the semiconductor chip CHP2 are mounted in the center of the wiring board 25, and the low-pass filters 16a and 16b are respectively disposed at a peripheral portion of the wiring board 25 with the semiconductor chip CHP2 interposed therebetween. Although the low-pas filters are disposed outside the conventional RF module in the RF module, the low-pass filters 16a and 16*b* are formed in the wiring board 25 in the RF module 5 according to the first embodiment.

Figure 18:
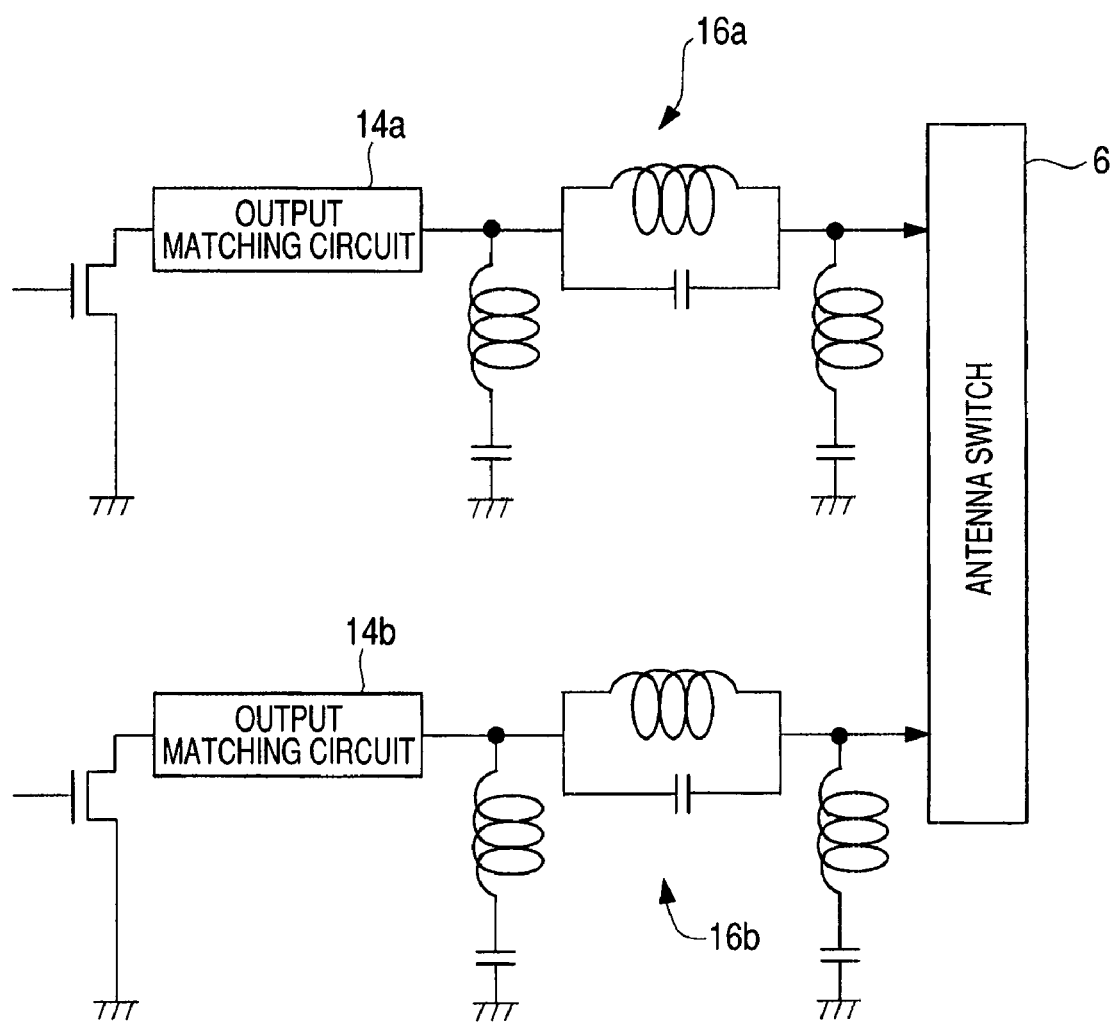
FIG. 18 is a diagram illustrating circuit configurations of the low-pass filters.

These low-pass filters 16*a* and 16*b* respectively take such a circuit configuration as shown in FIG. 18. Namely, the low-pass filters 16*a* and 16*b* are formed by coupling inductors and capacitive elements as shown in FIG. 18. The capacitive elements are mounted over the surface of the wiring board 25, whereas the inductors are formed using not only wires formed in the surface of the wiring board 25 but also wires formed inside the wiring board 25.

Thus, when, for example, the bonding wires BL2 formed inside the wiring board 25 are disposed up to the end sides of the semiconductor chips CHP1 and CHP2, the bonding wires and the internal wires or wirings that form the inductors of the low-pass filters 16*a* and 16*b* are brought close to one another. In doing so, there is a fear that this produces an adverse effect electrically. Further, the bonding wires BL2 and the internal wires that configure the inductors collide with one another physically. Thus, the bonding wires BL2 formed inside the wiring board 25 may not preferably be disposed up to the end sides of the semiconductor chips CHP1 and CH2.

Figure 19:
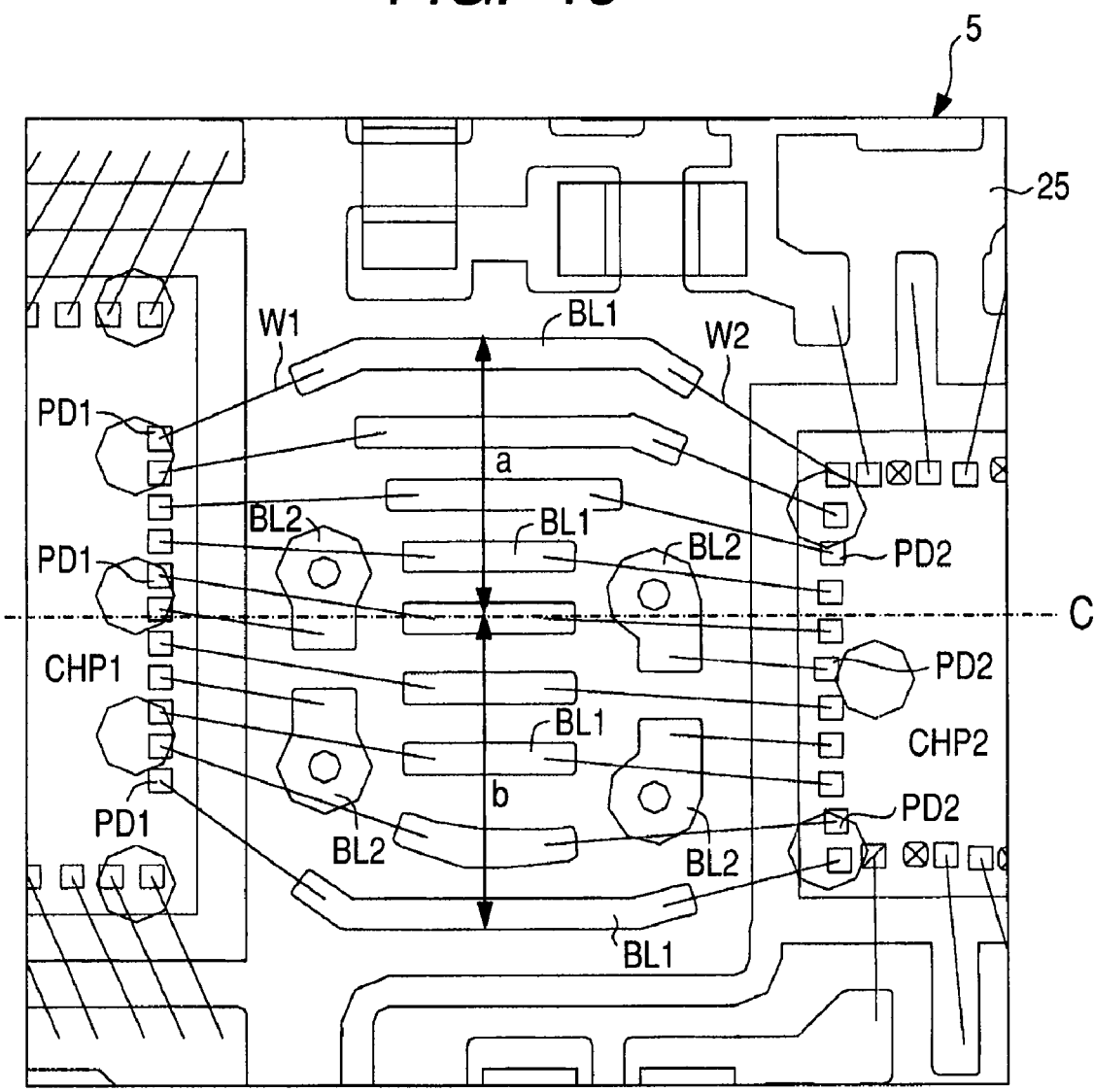
FIG. 19 is an enlarged view of a coupling area between the corresponding semiconductor chips mounted on the wiring board of the RF module and is diagram for describing layout positions of bonding wires.

The layout configuration of each bonding wire BL1 will next be explained. FIG. 19 is an enlarged view of a coupling area between semiconductor chips CHP1 and CHP2 mounted over the wiring board 25 of the RF module. As shown in FIG. 19, a plurality of the bonding wires BL1 are disposed so as to be parallel to a first side of the semiconductor chip CHP1, which corresponds to the direction in which pads PD1 are arranged. The bonding wires BL1 are disposed approximately symmetrically with respect to the center line C that passes through the center between the semiconductor chips CHP1 and CHP2. That is, assuming that the distance between the center line C and the bonding wire BL1 formed at the outermost end on the upper side is a and the distance between the center line C and the bonding wire BL1 formed at the outermost end on the lower side is b, the bonding wires BL1 are disposed in such a manner that the distance a and the distance b become approximately equal to each other.

Figure 20:
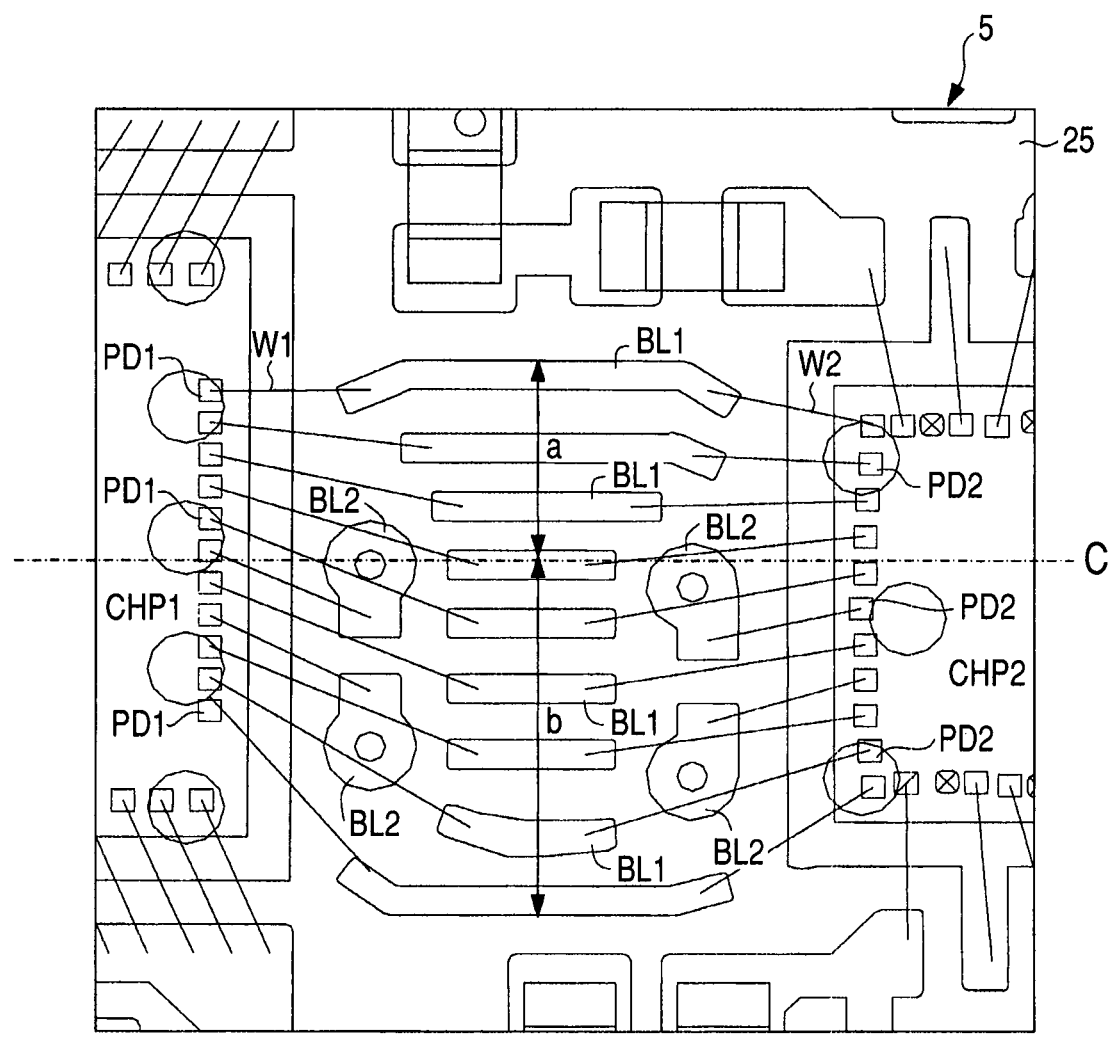
FIG. 20 is an enlarged view of a coupling area between the corresponding semiconductor chips mounted on the wiring board of the RF module and is a diagram for describing bonding wires.

FIG. 20 is an enlarged view of a coupling area between semiconductor chips CHP1 and CHP2 mounted over the wiring board 25 of the RF module. As shown in FIG. 20, a plurality of bonding wires BL1 are disposed so as to be parallel to a first side of the semiconductor chip CHP1, which corresponds to the direction in which pads PD1 are arranged. The bonding wires BL1 are disposed so as not to be symmetric with respect to the center line C that passes through the center between the semiconductor chips CHP1 and CHP2. That is, assuming that the distance between the center line C and the bonding wire BL1 formed at the outermost end on the upper side is a and the distance between the center line C and the bonding wire BL1 formed at the outermost end on the lower side is b, the boding wires BL1 are disposed in such a manner that the distance a becomes shorter than the distance b. Namely, the bonding wires BL1 are disposed in such a manner that space is ensured in an upper area as viewed from the center line C. The advantage of laying out the bonding wires BL1 in this way will be explained.

As described above, the low-pass filter 16*a* and the low-pass filter 16*b* are disposed at the peripheral portion of the wiring board 25 so as to interpose the semiconductor chip CHP2 therebetween. The circuit configurations of these low-pass filters 16*a* and 16*b* are similar as shown in FIG. 18. However, the low-pass filter 16*a* has the function of causing each signal lying in the GSM low frequency band to pass therethrough and attenuating harmonics contained in the signal lying in the GSM low frequency band. On the other hand, the low-pass filter 16*b* has the function of causing each signal lying in the GSM high frequency band to pass therethrough and attenuating harmonics contained in the signal lying in the GSM high frequency band. Thus, since the low-pass filter 16*a* and the low-pass filter 16*b* are different in the frequency of the targeted signal, the values of the inductors and capacitive elements are different even though the circuit configurations thereof are similar. Since the low-pass filter 16*a* is targeted for the signal lying in the GSM low frequency band in particular, the line length of each inductor becomes long as compared with the low-pass filter 16*b* targeted for the signal lying in the GSM high frequency band. That is, the low-pass filter 16*a* becomes larger in exclusively-possessed area than the low-pass filter 16*b*.

From the above point, the low-pass filter 16*a* and the low-pass filter 16*b* can be disposed efficiently by laying out the bonding wires BL1 in such a manner that space is ensured in the area in which the low-pass filter 16*a* is disposed, in other words, the upper area as viewed from the center line C.

Figure 21:
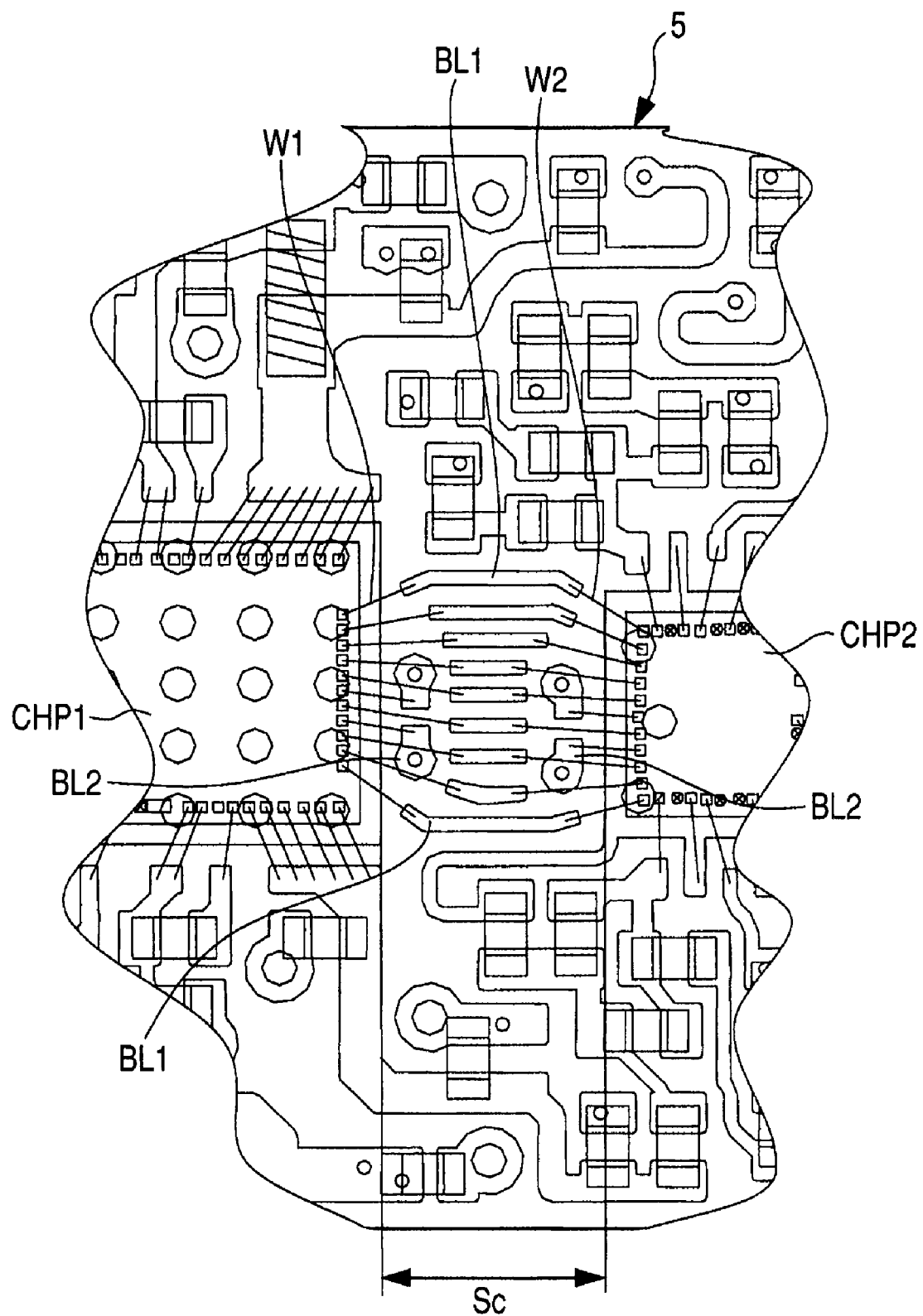
FIG. 21 is an enlarged view of a coupling area between the corresponding semiconductor chips mounted on the wiring board of the RF module and is a diagram for mentioning the distance between the semiconductor chips.

A description will next be made of a configuration where the distance between the semiconductor chip CHP1 and the semiconductor chip CHP2 changes. FIG. 21 is an enlarged view of a coupling area between the semiconductor chips CHP1 and CHP2 mounted over the wiring board 25 of the RF module 5. As shown in FIG. 21, the bonding wires BL1 formed in the surface of the wiring board 25 and the bonding wires BL2 formed inside the wiring board 25 are laid out between the semiconductor chips CHP1 and CHP2. The bonding wires BL1 and the semiconductor chip CHP1, and the bonding wires BL2 and the semiconductor chip CHP1 are coupled by their corresponding wires W1. The bonding wires BL1 and the semiconductor chip CHP2, and the bonding wires BL2 and the semiconductor chip CHP2 are coupled by their corresponding wires W2. At this time, the distance between the semiconductor chips CHP1 and CHP2 is Sc.

Figure 22:
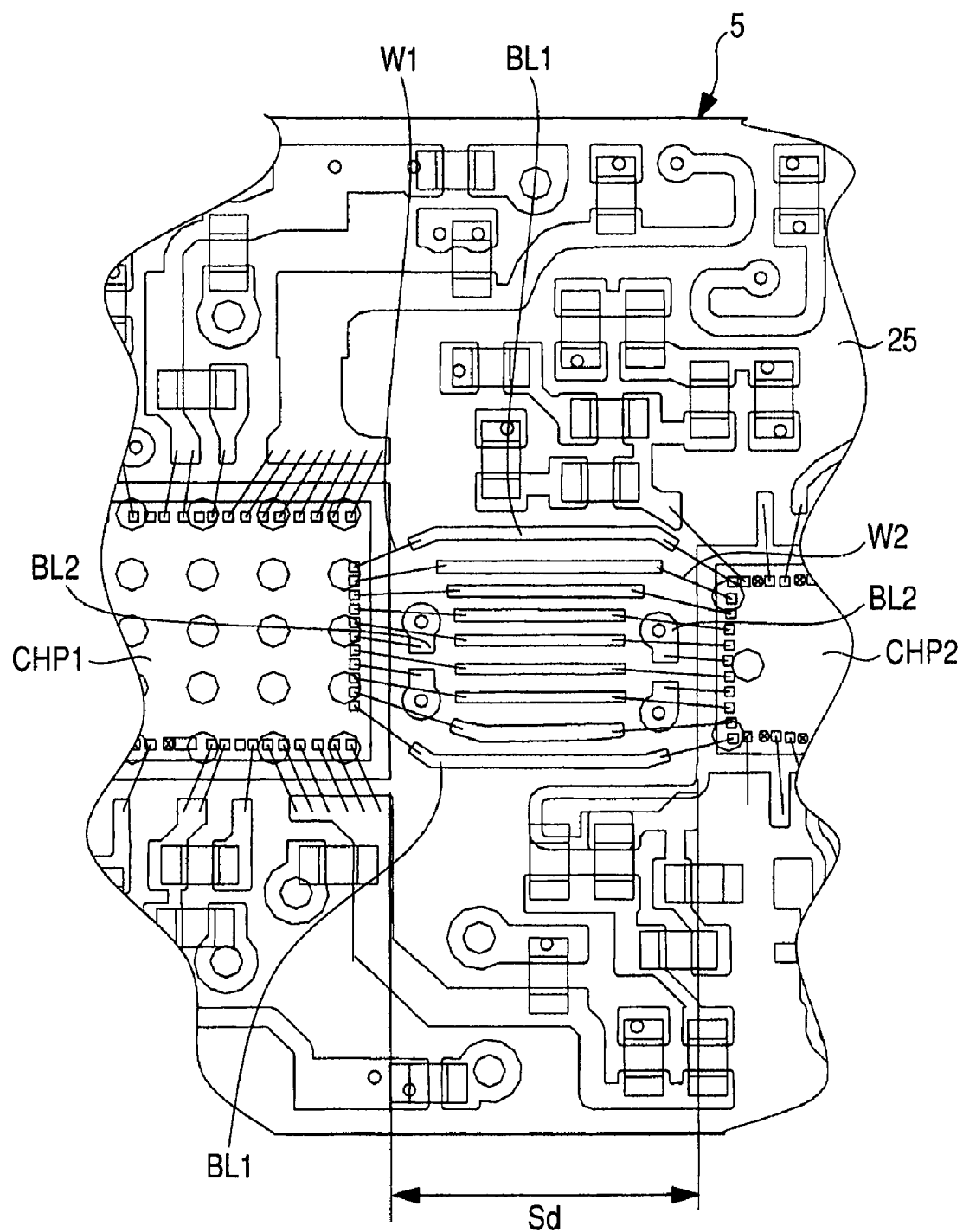
FIG. 22 is an enlarged view of a coupling area between the corresponding semiconductor chips mounted on the wiring board of the RF module and is a diagram for referring to the distance between the semiconductor chips.

Subsequently, FIG. 22 is a diagram showing the case in which the distance between the semiconductor chips CHP1 and CHP2 is set to Sd. The distance Sd is longer than the distance Sc shown in FIG. 21. Even in the case of this configuration, the bonding wires BL1 formed in the surface of the wiring board 25 and the bonding wires BL2 formed inside the wiring board 25 are laid out between the semiconductor chips CHP1 and the semiconductor chip CHP2. The bonding wires BL1 and the semiconductor chip CHP1, and the bonding wires BL2 and the semiconductor chip CHP1 are coupled by their corresponding wires W1. The bonding wires BL1 and the semiconductor chip CHP2, and the bonding wires BL2 and the semiconductor chip CHP2 are coupled by their corresponding wires W2. Adaptation to an increase in the distance between the semiconductor chip CHP1 and the semiconductor chip CHP2 is made by making the lengths of the bonding wires BL1 and BL2 longer. That is, adaptation to an increase in the distance Sc shown in FIG. 21 as compared with the distance Sd shown in FIG. 22 is not made by making the lengths of the wires W1 and W2 longer. This is because as the lengths of the wires W1 and W2 are set long, the influence of coupling becomes pronounced. It is thus understood that the difference in layout position between the semiconductor chips CHP1 and CHP2 mounted to the RF module is preferably adjusted by the lengths of the bonding wires BL1 and BL2 without making its adaptation by the lengths of the wires W1 and W2 in terms of a reduction in the influence of coupling. At this time, it is desirable to set the lengths of the wires W1 and W2 as short as possible.

Figure 23:
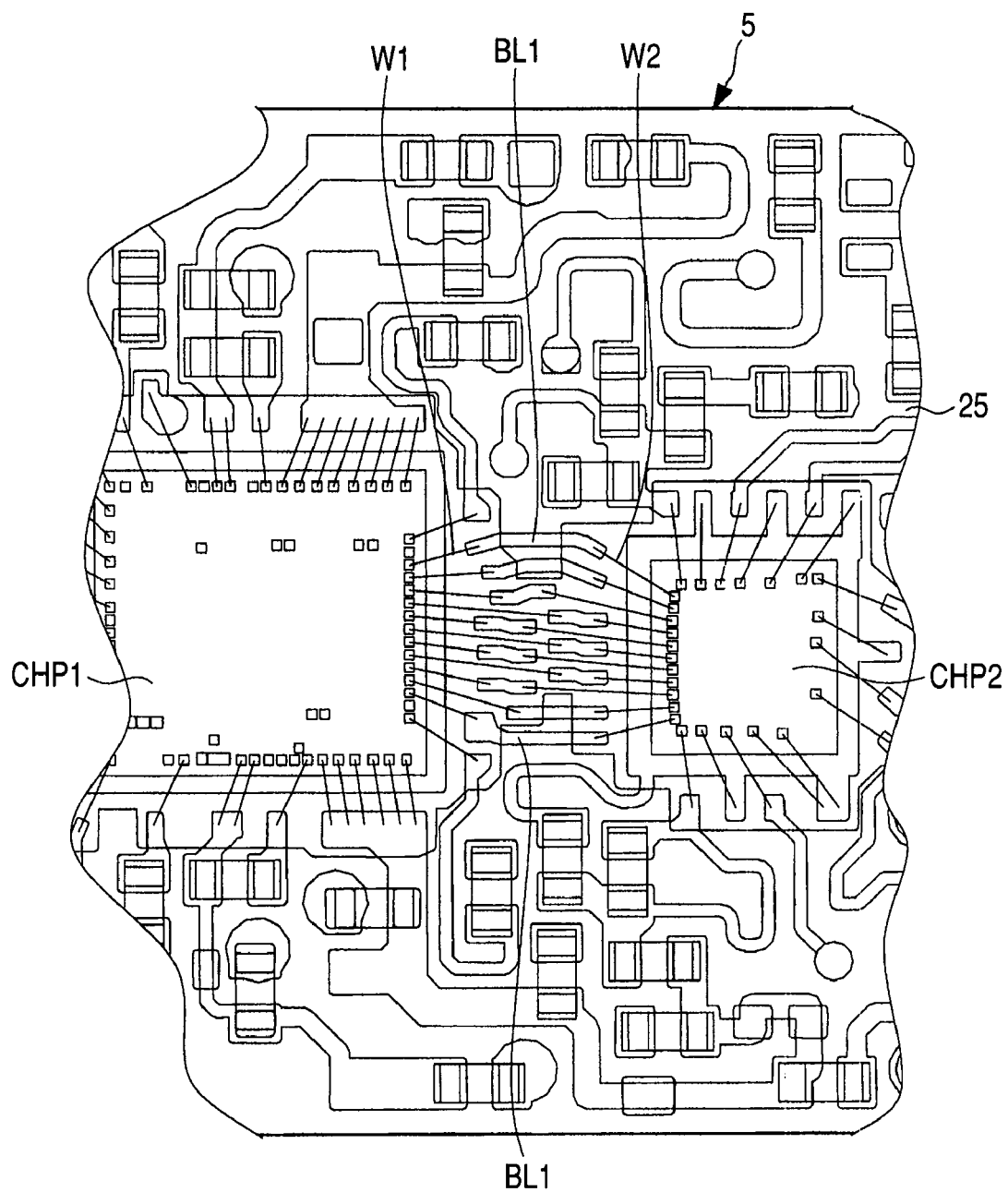
FIG. 23 is an enlarged view of a coupling area between the corresponding semiconductor chips mounted on the wiring board of the RF module and is a diagram for describing a configuration in which bonding wires are disposed in a zigzag manner.

A description will next be made of an example in which bonding wires BL1 formed in the surface of the wiring board 25 are laid out in zigzag form. FIG. 23 is an enlarged view of a coupling area between the semiconductor chips CHP1 and CHP2 mounted over the wiring board 25 of the RF module 5. As shown in FIG. 23, the bonding wires BL1 formed in the surface of the wiring board 25 are disposed between the semiconductor chips CHP1 and CHP2. The bonding wires BL1 and the semiconductor chip CHP1 are coupled by their corresponding wires W1. The bonding wires BL1 and the semiconductor chip CHP2 are coupled by their corresponding wires W2.

The bonding wires BL1 are laid out so as to be parallel to a first side of the semiconductor chip CHP1. The bonding wires BL1 disposed on the central side of the semiconductor chip CHP1 are laid out in zigzag form. It is thus possible to reduce the layout widths of the bonding wires BL1. Incidentally, in this case, the bonding wires BL1 disposed on the end side of the semiconductor chip CHP1 are not disposed in zigzag form. This is because when the bonding wires BL1 are placed in zigzag form as shown in FIG. 23, either the wires W1 or W2 become longer and they are susceptible to coupling. That is, when the lengths of the wires W1 or W2 become long, the influence of the coupling becomes large on the end side of the semiconductor chip CHP1. Therefore, the bonding wires BL1 disposed on the end side of the semiconductor chip CHP1 are formed long without being laid out in zigzag form. It is thus possible to shorten the lengths of the wires W1 or W2 on the end side of the semiconductor chip CHP1 and reduce the influence of coupling.

<Mounting Process of RF Module>

Figure 24:
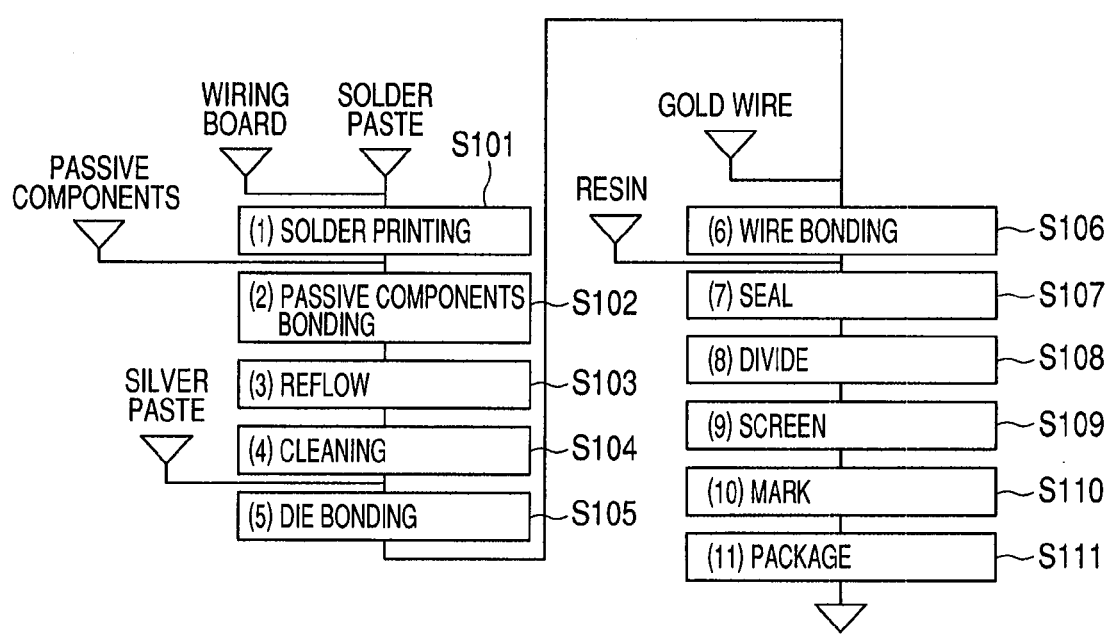
FIG. 24 is a flowchart showing a process of mounting the RF module.

A mounting process of the RF module according to the first embodiment will next be explained in brief with reference to FIG. 24. FIG. 24 is a flowchart showing the mounting process of the RF module. A wiring board is first prepared. The wiring board takes a multilayered wiring structure and has bonding wires formed in the surface of the wiring board and thereinside. Paste is printed onto the surface of the wiring board (S101). Subsequently, passive components are mounted over the surface of the wiring board by a mounter (S102). Thereafter, the wiring board with the passive components mounted thereon is reflowed to solder the passive components (S103). Then, flux contained in the solder paste is removed by cleaning (S104). Subsequently, a semiconductor chip comprised of a silicon substrate formed with amplifier circuits and a control circuit (including switch control circuit), and a semiconductor chip comprised of a compound semiconductor substrate formed with an antenna switch are die-bonded onto a die pad of the wiring board by silver paste (S105). The respective semiconductor chips and wires or wirings are wire-bonded. The respective semiconductor chips and the bonding wires formed in the surface of the wiring board or thereinside are coupled to one another by wires (gold wires) (S106). Thereafter, the sheet-like wiring board is sealed with a resin in block (S107). The sheet-like wiring board is divided into individual product units (S108). Subsequently, the individual products are subjected to a screening test (S109) and thereafter a mark display is conducted (S110). Thereafter, the products are packed and shipmented (S111). It is possible to manufacture the products each formed with the RF module in this way.

The first embodiment has explained the plural characteristics above. The respective characteristics can be used independently. Arbitrary plural characteristics may be combined.

Second Embodiment

Although the first embodiment has explained the example in which the LDMOSFETs are respectively used as the semiconductor elements that form the amplifier circuits, the present embodiment will explain an example in which HBT is used as a semiconductor element that forms an amplifier circuit.

Figure 25:
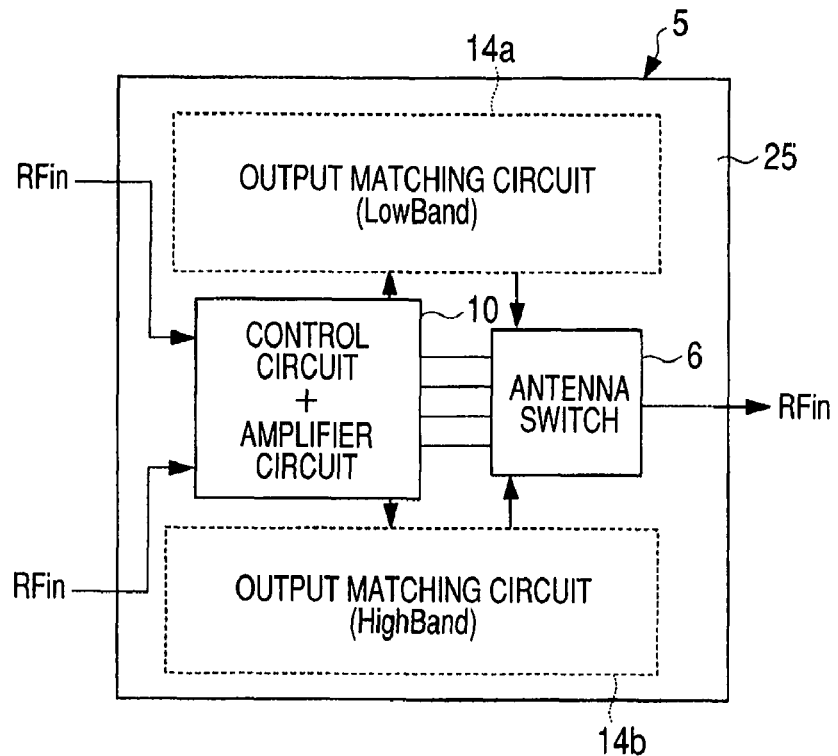
FIG. 25 is a block diagram showing a configuration of the RF module according to the first embodiment.

FIG. 25 is a block diagram showing the configuration of the RF module 5 according to the first embodiment. As shown in FIG. 25, the RF module 5 according to the first embodiment has an amplifier circuit 10 and an antenna switch 6. The amplifier circuit 10 is capable of amplifying each signal lying in a GSM low frequency band and each signal lying in a GSM high frequency band. An output matching circuit 14a is formed in the RF module 5 as for the signal lying in the GSM low frequency band, and an output matching circuit 14b is formed therein as for the signal lying in the GSM high frequency band.

The amplifier circuit 10 is formed with an amplifier circuit for amplifying a signal inputted to the RF module 5 and a control circuit for controlling the amplifier circuit. Since the amplifier circuit is comprised of the LDMOSFET in the first embodiment, it can be formed in the same semiconductor chip as CMOSFET that forms the control circuit. That is, in the first embodiment, the LDMOSFET and CMOSFET are formed over one semiconductor chip comprised of the silicon substrate. Thus, according to the first embodiment, a reduction in cost can be attained because the amplifier circuit and the control circuit can be formed in one semiconductor chip. Further, since the amplifier circuit is comprised of the LDMOSFET, the amplifier circuit low in noise can be configured.

The semiconductor chip that forms the amplifier circuit 10, and the semiconductor chip that forms the antenna switch 6 are electrically coupled to each other. As described in the first embodiment, the bonding wires formed inside the wiring board are used for part of such electrical coupling. It is thus possible to reduce the number of the bonding wires formed in the surface of the wiring board. Accordingly, the exclusively-possessed area of each of the bonding wires formed in the surface of the wiring board is reduced, and the layout areas of the output matching circuits 14a and 14b that form the RF module can hence be ensured sufficiently.

Although the LDMOSFET is used as for the amplifier circuit contained in the RF module 5 in the first embodiment, HBT is used for the amplifier circuit contained in the RF module 5 in the second embodiment.

There is known, for example, a semiconductor element that uses a group III-V compound semiconductor such as gallium arsenide (GaAs). The compound semiconductor has the characteristic that it is large in mobility as compared with silicon (Si) and semi-insulating crystalline is obtained. The compound semiconductor is capable of creating a mixed crystal and forming a heterojunction.

A heterojunction bipolar transistor (HBT) is used as a semiconductor element that uses the heterojunction. The HBT is of a bipolar transistor in which gallium arsenide is used for a base layer and Indium Gallium Phosphide (InGaP) or Aluminium Gallium Arsenic (AlGaAs) or the like is used for an emitter layer. That is, the HBT is of a bipolar transistor wherein semiconductor materials different between base and emitter layers are used to form a heterojunction.

With the heterojunction, the forbidden bandwidth of an emitter at a base-emitter junction can be made larger than that of a base. Thus, since the injection of carriers from the emitter to the base can be extremely increased as compared with the injection of carriers of reverse charges from the base to the emitter, the HBT has the characteristic that its current amplification gain becomes extremely large.

Since the current amplification gain of the HBT becomes extremely large as described above, the HBT is used in an RF module (power amplifier) mounted in a cellular phone, for example.

Figure 26:
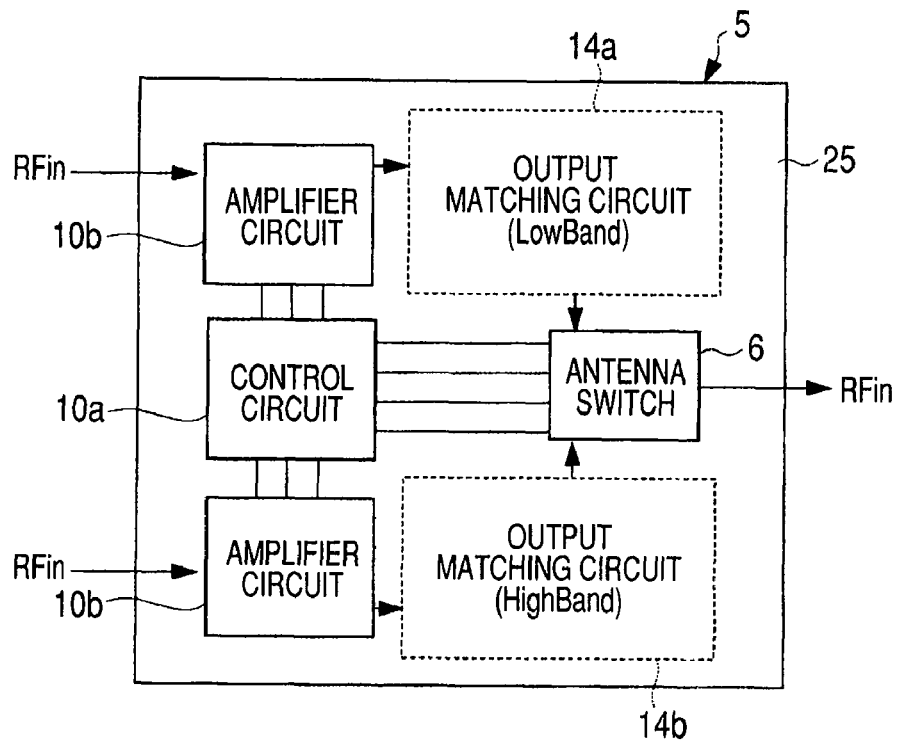
FIG. 26 is a block diagram showing a configuration of an RF module according to a second embodiment.

FIG. 26 is a block diagram showing a configuration of an RF module 5 according to the second embodiment. As shown in FIG. 26, the RF module 5 according to the second embodiment has a control circuit 10a, amplifier circuits 10b and an antenna switch 6. The amplifier circuit 10b is capable of amplifying a signal lying in a GSM low frequency band and a signal lying in a GSM high frequency band. An output matching circuit 14a is formed in the RF module 5 as for the signal lying in the GSM low frequency signal, and an output matching circuit 14b is formed therein as for the signal lying in the GSM high frequency band.

As shown in FIG. 26, the control circuit 10a and the amplifier circuits 10b are separated from one another in the RF module 5 according to the second embodiment. Namely, the control circuit 10a and the amplifier circuits 10b are respectively formed in semiconductor chips different from one another. This is because the HBT is used as the semiconductor element that configures the amplifier circuit 10b. That is, the HBT that configures each amplifier circuit 10b is formed in a compound semiconductor substrate such as a GaAs substrate, whereas MOSFETs that configure the control circuit 10a are formed in a silicon substrate. According to the second embodiment in this way, the gain or amplification factor of each amplifier circuit 10b can be enlarged by configuring the amplifier circuit 10b by the HBT although the control circuit 10a and the amplifier circuits 10b are separated from one another.

The RF module 5 shown in the second embodiment is similar to the RF module 5 shown in the first embodiment in terms of a configuration except that the HBT is used for each amplifier circuit 10b, and the control circuit 10a and the amplifier circuit 10b are formed in the semiconductor chips different from each other. Thus, even in the second embodiment, the control circuit 10a and the antenna switch 6 are electrically coupled to each other, and part of such electrical coupling can use bonding wires formed inside the corresponding wiring board in a manner similar to the case described in the first embodiment. It is thus possible to reduce the number of bonding wires formed in the surface of the wiring board. Accordingly, the exclusively-possessed area of each of the bonding wires formed in the surface of the wiring board becomes small, and the layout areas of the output matching circuits 14a and 14b that configure the RF module 5 can be ensured sufficiently. That is, since the characteristic configuration of the present invention, which has been described in the first embodiment, can be applied even in the second embodiment, the second embodiment can obtain advantageous effects similar to the first embodiment.

A plurality of characteristics have been explained above in the second embodiment. The respective characteristics can be used independently. A plurality of arbitrary characteristics may be combined.

While the invention made above by the present inventors has been described specifically on the basis of the preferred embodiments, the present invention is not limited to the embodiments referred to above. It is needless to say that various changes can be made thereto without the scope not departing from the gist thereof.

The present invention can widely be used in the manufacturing industry that manufactures a semiconductor device.

What is claimed is:

1. A semiconductor device comprising:
   (a) a wiring board having a multilayered wiring structure;
   (b) a first semiconductor chip mounted over the wiring board, including a power controller for controlling power amplification of a signal; and
   (c) a second semiconductor chip mounted over the wiring board, including an antenna switch,
   wherein electrical coupling between the power controller of the first semiconductor chip and the antenna switch of the semiconductor chip is conducted by (d1) a plurality of first pads formed in the first semiconductor chip, a plurality of first wires respectively electrically coupled to the first pads, and a plurality of bonding wires which have one ends respectively electrically coupled to the first wires and which are formed in the wiring board, and (d2) a plurality of second wires respectively electrically coupled to the other ends of the bonding wires and a plurality of second pads respectively electrically coupled to the second wires and formed in the second semiconductor chip, and
   wherein the bonding wires include a plurality of first bonding wires formed in the surface of the wiring board and a plurality of second bonding wires formed inside the wiring board.

2. The semiconductor device according to claim 1, wherein the bonding wires are formed in the wiring board so as to be interposed between the first semiconductor chip and the second semiconductor chip.

3. The semiconductor device according to claim 2,
   wherein the first pads are arranged at a first side of the first semiconductor chip,
   wherein the second pads are arranged at a second side of the second semiconductor chip, and
   wherein the arrangement of the first pads and the arrangement of the second pads are provided side by side so as to interpose the bonding wires therebetween.

4. The semiconductor device according to claim 1, wherein the second bonding wires include wires for transmitting signals sent from the first semiconductor chip to the second semiconductor chip.

5. The semiconductor device according to claim 4, wherein the second bonding wires include a wire for transmitting a changeover control signal for controlling switching of the antenna switch formed in the second semiconductor chip.

6. The semiconductor device according to claim 5, wherein the antenna switch includes a field effect transistor, and the changeover control signal is of a signal which is applied to a gate electrode of the field effect transistor thereby to control turning ON/OFF of the field effect transistor.

7. The semiconductor device according to claim 6, wherein the field effect transistor is a high electron mobility transistor.

8. The semiconductor device according to claim 4, wherein the second bonding wires include a power wire for supplying power to the antenna switch formed in the second semiconductor chip.

9. The semiconductor device according to claim 1, wherein the second bonding wires include wires for transmitting signals sent from the second semiconductor chip to the first semiconductor chip.

10. The semiconductor device according to claim 1, wherein the first semiconductor chip is provided with a power amplifying unit for amplifying power of each signal in addition to the power controller for controlling the power amplification of the signal.

11. The semiconductor device according to claim 10,
wherein the second semiconductor chip has a detection unit for detecting the power of the signal amplified by the power amplifying unit,
wherein the power controller formed in the first semiconductor chip controls power amplification of the signal, based on a detection signal from the detection unit formed in the second semiconductor chip, and
wherein the second bonding wires include a wire for transmitting the detection signal.

12. The semiconductor device according to claim 10, wherein the first semiconductor chip includes a plurality of power amplifying units for amplifying power of signals different in frequency band in addition to the power controller.

13. The semiconductor device according to claim 12,
wherein the power amplifying units includes a first power amplifying unit for amplifying a first signal lying in a first frequency band and a second power amplifying unit for amplifying a second signal lying in a band different from the first frequency band,
wherein the antenna switch has a first selector switch for transmitting either the amplified first signal or the amplified second signal from an antenna and a second selector switch for inputting the signal received by the antenna to a receiving circuit,
wherein the first selector switch is controlled by a first changeover control signal outputted from the power controller and the second selector switch is controlled by a second changeover control signal outputted from the power controller, and
wherein the second bonding wires include a wire for transferring the first changeover control signal, whereas the first bonding wires include a wire for transferring the second changeover control signal.

14. The semiconductor device according to claim 10,
wherein the wiring board is provided with (e) a matching circuit for taking impedance matching and (f) a selection circuit for causing signals lying plural frequency bands to signals lying in a frequency band in a specific range to pass therethrough,
wherein the output of the power amplifying unit formed in the first semiconductor chip is inputted to the matching circuit,
wherein the output of the matching circuit is inputted to the selection circuit,
wherein the output of the selection output is inputted to the antenna switch formed in the second semiconductor chip, and
wherein the output from the antenna switch is transmitted through the antenna.

15. The semiconductor device according to claim 14, wherein the selection circuit is configured using first wires formed in the surface of the wiring board and second wires formed inside the wiring board.

16. The semiconductor device according to claim 14,
wherein the bonding wires are disposed between a first side of the first semiconductor chip over which the first pads are arranged, and a second side of the second semiconductor chip over which the second pads are arranged and which is provided side by side with the first side, in such a manner that the bonding wires are aligned in the direction parallel to the first side and the second side,
wherein a width in which the bonding wires are disposed side by side is smaller than either a width of the first side or a width of the second side,
wherein a plurality of third pads for outputting the power sent from the power amplifying unit are formed at a third side which intersects with the first side of the first semiconductor chip,
wherein the third pads and the matching circuit formed over the wiring board are respectively coupled by a plurality of third wires,
wherein a plurality of fourth pads coupled to the antenna switch are formed at a fourth side which intersects with the second side of the second semiconductor chip,
wherein the fourth pads and the selection circuit formed over the wiring board are respectively coupled by a plurality of fourth wires,
wherein the first wires and the third wires are placed in a layout relationship in which the first and third wires are not brought into contact with one another and intersect on a plane basis where the first and third wires extend, and
wherein the second wires and the fourth wires are placed in a layout relationship in which the second and fourth wires are not brought into contact with one another and intersect on a plane basis where the second and fourth wires extend.

17. The semiconductor device according to claim 16,
wherein the angle which each of the first wires forms with each of the third wires ranges from 45° or more to 135° or less, and
wherein the angle which each of the second wires forms with each of the fourth wires ranges from 45° or more to 135° or less.

18. The semiconductor device according to claim 1,
wherein the bonding wires are disposed between a first side of the first semiconductor chip over which the first pads are arranged, and a second side of the second semiconductor chip over which the second pads are arranged and which is parallel to the first side, in such a manner that the bonding wires are aligned in the direction parallel to the first side and the second side, and
wherein a width in which the bonding wires are disposed side by side is smaller than either a width of the first side or a width of the second side.

19. The semiconductor device according to claim 18,
wherein the bonding wires include the first bonding wires, and
wherein the first bonding wire disposed on the end side of the first or second side, of the first bonding wires is longer in wiring length than the first bonding wire disposed on the central side of the first or second side.

20. The semiconductor device according to claim 19, wherein the length of the first wire coupled to the first bonding wire disposed on the end side of the first side, of the first wires is shorter than the length of the first wire coupled to the first bonding wire disposed on the central side of the first side.

21. The semiconductor device according to claim 19, wherein the length of the second wire coupled to the first bonding wire disposed on the end side of the second side, of the second wires is longer than the length of the second wire coupled to the first bonding wire disposed on the central side of the second side.

22. The semiconductor device according to claim 18,
wherein the bonding wires include the first bonding wires and the second bonding wires,
wherein the first bonding wires are disposed from the central side of the first or second side to the end side of the first or second side, and wherein the second boding wires are disposed on the central side of the first or second side and are not disposed on the end side of the first or second side.

23. The semiconductor device according to claim 18, wherein a layout in which the bonding wires are disposed side by side, is not symmetrical with respect to a center line which passes through the center of the first side or a center line which passes through the center of the second side.

24. The semiconductor device according to claim 23,
wherein the wiring board includes a first matching circuit which is electrically coupled to a first power amplifying unit for amplifying power of a first signal lying in a first frequency band and which takes impedance matching to transfer the power efficiently, a first selection circuit which is electrically coupled to the first matching circuit and selects a signal lying in a frequency band in a specific range from signals lying in a plurality of frequency bands, a second matching circuit which is electrically coupled to a second power amplifying unit for amplifying power of a second signal lying in a second frequency band higher than the first signal of the first frequency band and takes impedance matching to transfer the power efficiently, and a second selection circuit which is electrically coupled to the second matching circuit and selects a signal lying in a specific frequency band from signals lying in a plurality of frequency bands, wherein the first matching circuit and the first selection circuit are disposed in the direction which intersects with the direction in which the first semiconductor chip and the second semiconductor chip are aligned, and the first matching circuit and the first selection circuit are disposed on the side opposite to the second matching circuit and the second selection circuit through the first semiconductor chip and the second semiconductor chip, wherein a layout in which the bonding wires are disposed side by side, is placed with being shifted in the direction in which the second matching circuit and the second selection circuit are formed, and wherein space is ensured on the formation side of the first matching circuit and the first selection circuit.

* * * * *